(12) United States Patent
Woo et al.

(10) Patent No.: US 10,469,789 B2
(45) Date of Patent: Nov. 5, 2019

(54) DIGITAL DEVICE FOR IMPROVING IMAGE QUALITY WITH LOW POWER AND CONTROL METHOD THEREOF

(71) Applicants: LG ELECTRONICS INC., Seoul (KR); INHA UNIVERSITY RESEARCH AND BUSINESS FOUNDATION, Incheon (KR)

(72) Inventors: Hunbae Woo, Seoul (KR); Cheoljoo Lee, Seoul (KR); Byungcheol Song, Seoul (KR); Yeonoh Nam, Goyang-si (KR); Dongyoon Choi, Seonsan-si (KR)

(73) Assignees: LG ELECTRONICS INC., Seoul (KR); INHA UNIVERSITY RESEARCH AND BUSINESS FOUNDATION, Incheon (KR)

( * ) Notice: Subject to any disclaimer, the term of this patent is extended or adjusted under 35 U.S.C. 154(b) by 254 days.

(21) Appl. No.: 15/527,695

(22) PCT Filed: Mar. 20, 2015

(86) PCT No.: PCT/KR2015/002751
§ 371 (c)(1),
(2) Date: May 17, 2017

(87) PCT Pub. No.: WO2016/080603
PCT Pub. Date: May 26, 2016

(65) Prior Publication Data
US 2019/0089924 A1    Mar. 21, 2019

(30) Foreign Application Priority Data

Nov. 18, 2014 (KR) .......................... 10-2014-0160958

(51) Int. Cl.
*H04N 5/52* (2006.01)
*H04N 5/57* (2006.01)
(Continued)

(52) U.S. Cl.
CPC ................. *H04N 5/52* (2013.01); *H03G 3/20* (2013.01); *H04N 5/4401* (2013.01); *H04N 5/57* (2013.01);
(Continued)

(58) Field of Classification Search
None
See application file for complete search history.

(56) References Cited

U.S. PATENT DOCUMENTS 6,072,907 A * 6/2000 Taylor .................... G06K 9/38
358/1.9
2006/0127081 A1 * 6/2006 Lee ...................... G09G 3/3406
396/282

(Continued)

FOREIGN PATENT DOCUMENTS

KR    1020120075805    7/2012
KR    1020120122157    11/2012

(Continued)

OTHER PUBLICATIONS

PCT International Application No. PCT/KR2015/002751, Written Opinion of the International Searching Authority dated Jul. 21, 2015, 17 pages.

*Primary Examiner* — Jefferey F Harold
*Assistant Examiner* — Humam M Satti
(74) *Attorney, Agent, or Firm* — Lee, Hong, Degerman, Kang & Waimey

(57) ABSTRACT

A digital device and a control method thereof are disclosed in the present specification. The digital device and the control method thereof according to the present invention
(Continued)

may comprise the steps of receiving an image signal; separating the received image signal by a plurality of frequency bands; adjusting a gain for the image signal of each of the separated frequency bands; displaying an enhanced image on a screen by synthesizing the image signals of the respective frequency bands in which the gain has been adjusted; separating the screen, on which the enhanced image is displayed, into a plurality of areas; checking whether the maximum pixel value of the enhanced image displayed on the separated screen area, if the maximum pixel value of the enhanced image is larger than the reference value.

18 Claims, 26 Drawing Sheets

(51) Int. Cl.
  *H04N 5/63* (2006.01)
  *H03G 3/20* (2006.01)
  *H04N 5/44* (2011.01)
  *H04N 21/443* (2011.01)
  *H04N 21/4402* (2011.01)

(52) U.S. Cl.
  CPC ........... *H04N 5/63* (2013.01); *H04N 21/4436* (2013.01); *H04N 21/440245* (2013.01)

(56) References Cited

U.S. PATENT DOCUMENTS

| | | | | |
|---|---|---|---|---|
| 2007/0291048 | A1* | 12/2007 | Kerofsky | G09G 3/3406 345/589 |
| 2010/0066752 | A1* | 3/2010 | Watanuki | G09G 3/3426 345/589 |
| 2010/0188531 | A1* | 7/2010 | Cordes | G06T 5/001 348/235 |
| 2010/0310189 | A1* | 12/2010 | Wakazono | G06T 5/008 382/258 |
| 2013/0101222 | A1* | 4/2013 | Hamada | G06T 3/4053 382/195 |
| 2013/0321705 | A1* | 12/2013 | Nakagoshi | H04N 5/14 348/606 |
| 2014/0085360 | A1* | 3/2014 | Ohno | G09G 3/3426 345/694 |

FOREIGN PATENT DOCUMENTS

KR    101329969    11/2013
KR    101366421    2/2014

* cited by examiner

DIGITAL DEVICE FOR IMPROVING IMAGE QUALITY WITH LOW POWER AND CONTROL METHOD THEREOF

CROSS-REFERENCE TO RELATED APPLICATIONS

This application is the National Stage filing under 35 U.S.C. 371 of International Application No. PCT/KR2015/002751, filed on Mar. 20, 2015, which claims the benefit of earlier filing date and right of priority to Korean Application No. 10-2014-0160958, filed on Nov. 18, 2014, the contents of which are all hereby incorporated by reference herein in their entirety.

TECHNICAL FIELD

The present invention relates to a digital device, and more particularly, a digital device for improving image quality with low power and control method thereof.

BACKGROUND ART

Recently, digital devices including a monitor, a TV, and the like have become larger and been widely used. However, as the digital devices become larger, power consumption is also increased. Accordingly, a digital device capable of reducing power consumption to save energy without degradation in image quality needs to be developed.

In a digital device such as an LCD device, most power is consumed by a backlight portion. Specifically, one-half of the total power is used for the backlight portion. That is, power consumption of the digital device is proportional to brightness of a light source used as backlight and the brightness of the light source depends on a pixel value of an image to be displayed. In addition, the brightness of the light source is determined depending on a maximum pixel value of an area managed by the corresponding light source. Hence, if the maximum brightness of the image is decreased, the brightness of the light source may be decreased, thereby reducing the power consumption of the digital device.

In the related art, a method of linearly decreasing an image pixel value has been used to restrict the power consumption of the digital device. However, the method has the following problems. That is, contrast and sharpness of an image is decreased due to a decreased dynamic range of the image and thus, overall image quality is degraded. In addition, overall brightness of the image is also decreased. As another method, a histogram equalization scheme has been used to restrict the power consumption of the digital device. According to the method, although a certain level of the image brightness and contrast can be secured, the brightness may be changed at an area boundary in case of using a local dimming scheme where the brightness of the light source is adjusted by using the maximum pixel value of the image in a non-uniform manner, which causes problems that artifacts occur and details of a bright part disappear.

Therefore, a digital device suitable for the local dimming scheme for reducing power consumption and minimizing degradation of image quality when a dynamic range is reduced due to decreased image brightness needs to be developed.

DISCLOSURE OF THE INVENTION

Technical Task

A technical task of the present invention is to provide a digital device for minimizing image quality degradation while reducing power consumption by performing a pre-processing process for improving contrast and sharpness of an image and a post processing process for dividing a screen and adjusting a maximum pixel value in each of the divided screen and control method thereof.

Another technical task of the present invention is to provide a digital device for minimizing image quality degradation while reducing power consumption based on a target power saving amount, which is configured by a user through a displayed configuration window, to improve user convenience and control method thereof.

It will be appreciated by persons skilled in the art that the objects that could be achieved with the present invention are not limited to what has been particularly described hereinabove and the above and other objects that the present invention could achieve will be more clearly understood from the following detailed description.

Technical Solutions

In an aspect of the present invention, provided herein is a method of controlling a digital device, including: receiving an image signal; separating the received image signal into a plurality of frequency bands; adjusting gains of image signals separated into the respective frequency bands; displaying an enhanced image on a screen by synthesizing the images signals in the respective frequency bands of which the gains are adjusted; dividing the screen on which the enhanced image is displayed into a plurality of screen areas; checking whether a maximum pixel value of the enhanced image displayed on the divided screen areas is greater than a reference value; and when the maximum pixel value of the enhanced image is greater than the reference value, adjusting a pixel value of the enhanced image displayed on the divided screen areas.

In another aspect of the present invention, provided herein is a digital device, including: a communication module configured to receive an image signal; a display module configured to display an enhanced image on a screen after processing the image signal; and a controller for controlling operation of the digital device. In this case, the controller may include: a frequency separation unit configured to separate the received image signal into a plurality of frequency bands; a gain control unit configured to adjust gains of the image signals separated by the frequency separation unit into the respective frequency bands, synthesize the images signals in the respective frequency bands of which the gains are adjusted, and control the display module to display the enhanced image on the screen of the display module; and a pixel value adjustment unit configured to divide the screen of the display module on which the enhanced image is displayed into a plurality of screen areas, check whether a maximum pixel value of the enhanced image displayed on the divided screen areas is greater than a reference value, and when the maximum pixel value of the enhanced image is greater than the reference value, adjust a pixel value of the enhanced image displayed on the divided screen areas.

It will be appreciated by persons skilled in the art that the solutions that can be achieved through the present invention are not limited to what has been particularly described hereinabove and other solutions of the present invention will be more clearly understood from the following detailed description.

Advantageous Effects

According to an embodiment of the present invention, it is possible to minimize image quality degradation while reducing power consumption by performing a pre-processing process for improving contrast and sharpness of an image and a post processing process for dividing a screen and adjusting a maximum pixel value in each of the divided screen.

In addition, according to an embodiment of the present invention, it is possible to minimize image quality degradation while reducing power consumption based on a target power saving amount, which is configured by a user through a displayed configuration window, thereby improving user convenience.

It will be appreciated by persons skilled in the art that the effects that can be achieved through the present invention are not limited to what has been particularly described hereinabove and other advantages of the present invention will be more clearly understood from the following detailed description.

BEST MODE FOR INVENTION

Figure 1:
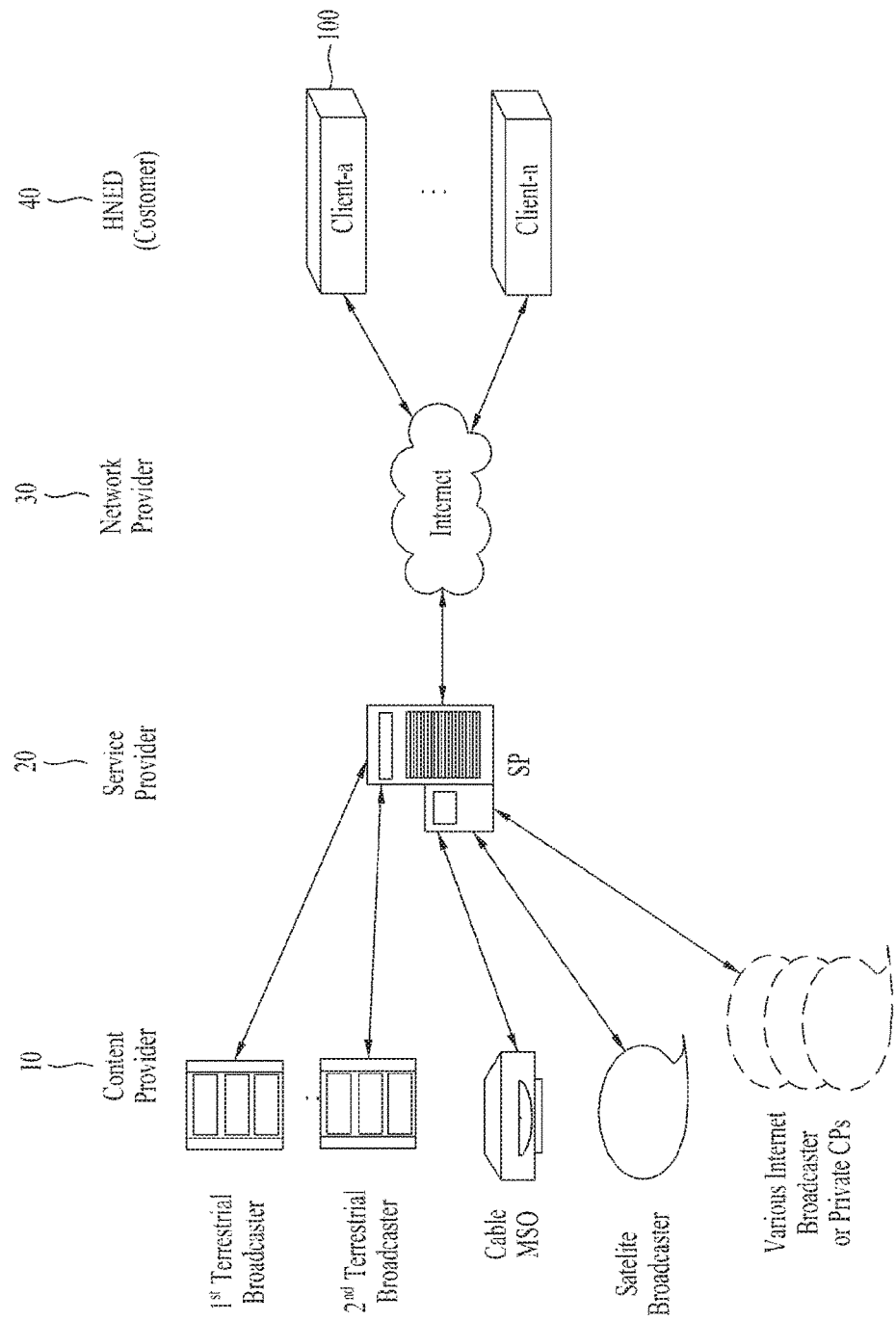
FIG. 1 is a schematic diagram illustrating a service system including a digital device according to an embodiment of the present invention.

Description will now be given in detail according to exemplary embodiments disclosed herein, with reference to the accompanying drawings.

In general, a suffix such as "module" and "unit" can be used to refer to elements or components. Use of such a suffix herein is merely intended to facilitate description of the specification, and the suffix itself is not intended to give any special meaning or function. Meanwhile, such an ordinal number as 'first', 'second', 'third' and the like can have a meaning of an order. Yet, the terminologies can be used for the purpose of distinguishing one component from another component capable of being overlapped with each other. In the present disclosure, that which is well-known to one of ordinary skill in the relevant art has generally been omitted for the sake of brevity.

The accompanying drawings are used to help easily understand various technical features and it should be understood that the embodiments presented herein are not limited by the accompanying drawings.

As such, the present disclosure should be construed to extend to any alterations, equivalents and substitutes in addition to those which are particularly set out in the accompanying drawings.

A digital device according to the present invention as set forth herein can be any device that can handle any one of transmitting, receiving, handling and outputting data, content, servicer, application, and so forth. The digital device can be connected to other digital devices through wired network or wireless network, paired or connected to external server, and through the connections, the digital device can transmit and receive the prescribed data. Examples of the digital device can include standing devices such as a network TV, a Hybrid Broadcast Broadband TV (HBBTV), a smart TV, Internet Protocol TV (IPTV), and personal computer (PC), or mobile/handheld devices such as a Personal Digital Assistant (PDA), smart phone, tablet PC, or Notebook computer. For convenience of description, in this specification, Digital TV is used in FIG. 2 and mobile device is used in FIG. 3 depicting the digital device. Further, the digital device in this specification can be referred to configuration having only a panel, set-top box (STB), or a set including the entire system.

Moreover, the wired or wireless network described in this specification can refer to various pairing method, standard telecommunication network protocol methods supported for transmitting and receiving data between digital devices or between digital device and external server. The wired or wireless network also includes various telecommunication network protocols supported now as well as in the future. Examples of the wired or wireless network include wired network supported by various telecommunication standard such as Universal Serial Bus (USB), Composite Video Banking Sync (CVBS), Component, S-Video (analog), Digital Visual Interface (DVI), High Definition Multimedia Interface (HDMI), RGB, D-SUB and so forth, and wireless network supported by various standards including Bluetooth, Radio Frequency Identification (RFID), infrared Data Association (IrDA), Ultra Wideband (UWB), ZigBee, Digital Living Network Alliance (DLNA), Wireless LAN (WLAN)(Wi-Fi), Wireless broadband (Wibro), World Interoperability for Microwave Access (Wimax), High Speed Downlink Packet (HSDPA), Long Term Evolution/LTE-Advanced (LTE/LTE-A), Wi-Fi direct, and so forth.

In addition, when this specification refers simply to the digital device, it can mean a standing device or a mobile device depending on the context, and when it is not referred to a specific device, the digital device referred in this specification refers to both standing and mobile device.

Meanwhile, the digital device can perform intelligent functions such as receiving broadcasting program, operating computer functions, and supporting at least one external input, and by being connected through the network wired or wirelessly, the digital device can support e-mail functions, web browsing functions, banking, gaming, and executing applications. The digital device can further include an interface for any one of input or control means (hereinafter referred as "input means") supporting handwriting input, touch-screen, and space remote control.

Furthermore, the digital device can use standard operating system (OS), however, the digital device described in this specification and the embodiments, uses Web OS. Therefore, the digital device can perform functions such as adding, deleting, amending, and updating the various services and applications for standard universal OS kernel or Linux kernel in order to construct a more user-friendly environment.

When the digital device, described above, receives and handles external input, the external input includes external input devices described above, meaning all input means or digital devices, capable of transmitting and receiving data through wired or wireless network connected to and from the digital device. For example, the external input includes High Definition Multimedia Interface (HDMI), game devices such as playstation or X-Box, smart phone, tablet PC, printing device such as pocket photo, digital devices such as smart TV and blue-ray device.

The "server" referred to as in this application, includes digital device or system capable of transmitting and receiving data to and from client, and can also be referred to as a processor. For example, the server can be servers providing services such as portal server providing web page, web content or web service, advertising server providing advertising data, content server, Social Network Service (SNS) server providing SNS service, service server providing service to manufacturer, Multichannel Video Programming Distributor (MVPD) providing Vide on Demand or streaming service, and service server providing pay services.

In this application, when application is described for the convenience of explanation, the meaning of application in the context can include services as well as applications.

In the following description, various embodiments according to the present invention are explained with reference to attached drawings.

FIG. 1 illustrates a broadcast system including a digital receiver according to an embodiment of the present invention.

Referring to FIG. 1, examples of a broadcast system comprising a digital receiver may include a content provider (CP) 10, a service provider (SP) 20, a network provider (NP) 30, and a home network end user (HNED) (Customer) 40. The HNED 40 includes a client 100, that is, a digital receiver.

The CP 10 is an entity that produces content. Referring to FIG. 1, the CP 10 can include a 1st or 2nd terrestrial broadcaster, a cable system operator (SO), a multiple system operator (MSO), a satellite broadcaster, various Internet broadcasters, private content providers (CPs), etc. The content can include applications as well as broadcast content.

The SP 20 packetizes content provided by the CP 10. Referring to FIG. 1, the SP 20 packetizes content provided by the CP 10 into one or more services available for users.

The SP 20 can provide services to the client 100 in a uni-cast or multi-cast manner.

The CP 10 and the SP 20 can be configured in the form of one entity. For example, the CP 10 can function as the SP 20 by producing content and directly packetizing the produced content into services, and vice versa.

The NP 30 can provide a network environment for data exchange between the server 10 and/or 20 and the client 100. The NP 30 supports wired/wireless communication protocols and constructs environments therefor. In addition, the NP 30 can provide a cloud environment.

The client 100 can construct a home network and transmit/receive data.

The server can use and request a content protection means such as conditional access. In this case, the client 100 can use a means such as a cable card or downloadable CAS (DCAS), which corresponds to the content protection means of the server.

In addition, the client 100 can use an interactive service through a network. In this case, the client 100 can directly serve as the CP 10 and/or the SP 20 in a relationship with another client or indirectly function as a server of the other client.

Each of the CP 10, SP 20 and NP 30, or a combination thereof may be referred to as a server. The HNED 40 can also function as a server. The term 'server' means an entity that transmits data to another entity in a digital broadcast environment. Considering a server-client concept, the server can be regarded as an absolute concept and a relative concept. For example, one entity can be a server in a relationship with a first entity and can be a client in a relationship with a second entity.

Figure 2:
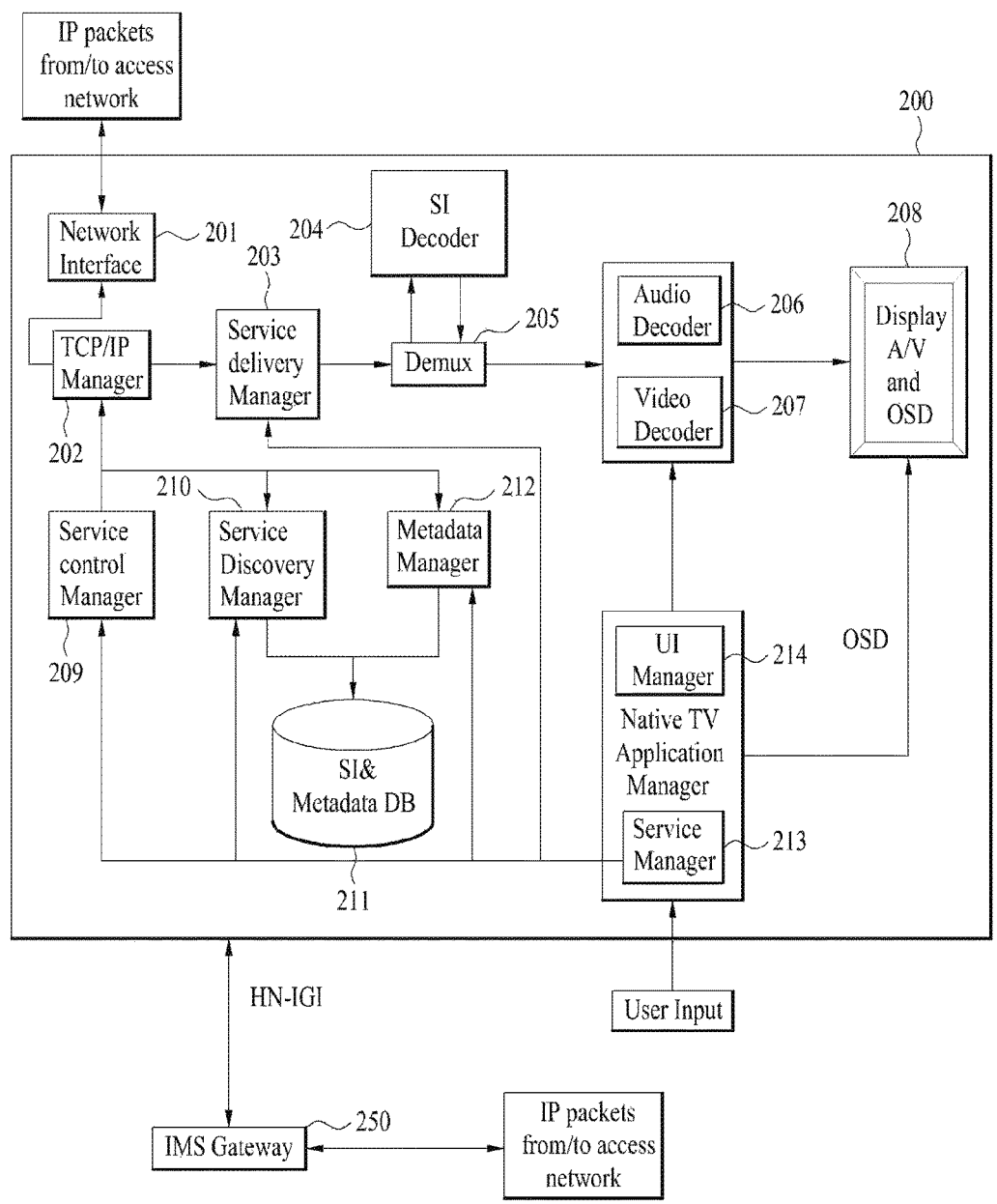
FIG. 2 is a block diagram illustrating a digital device according to one embodiment of the present invention.
Figure 3:
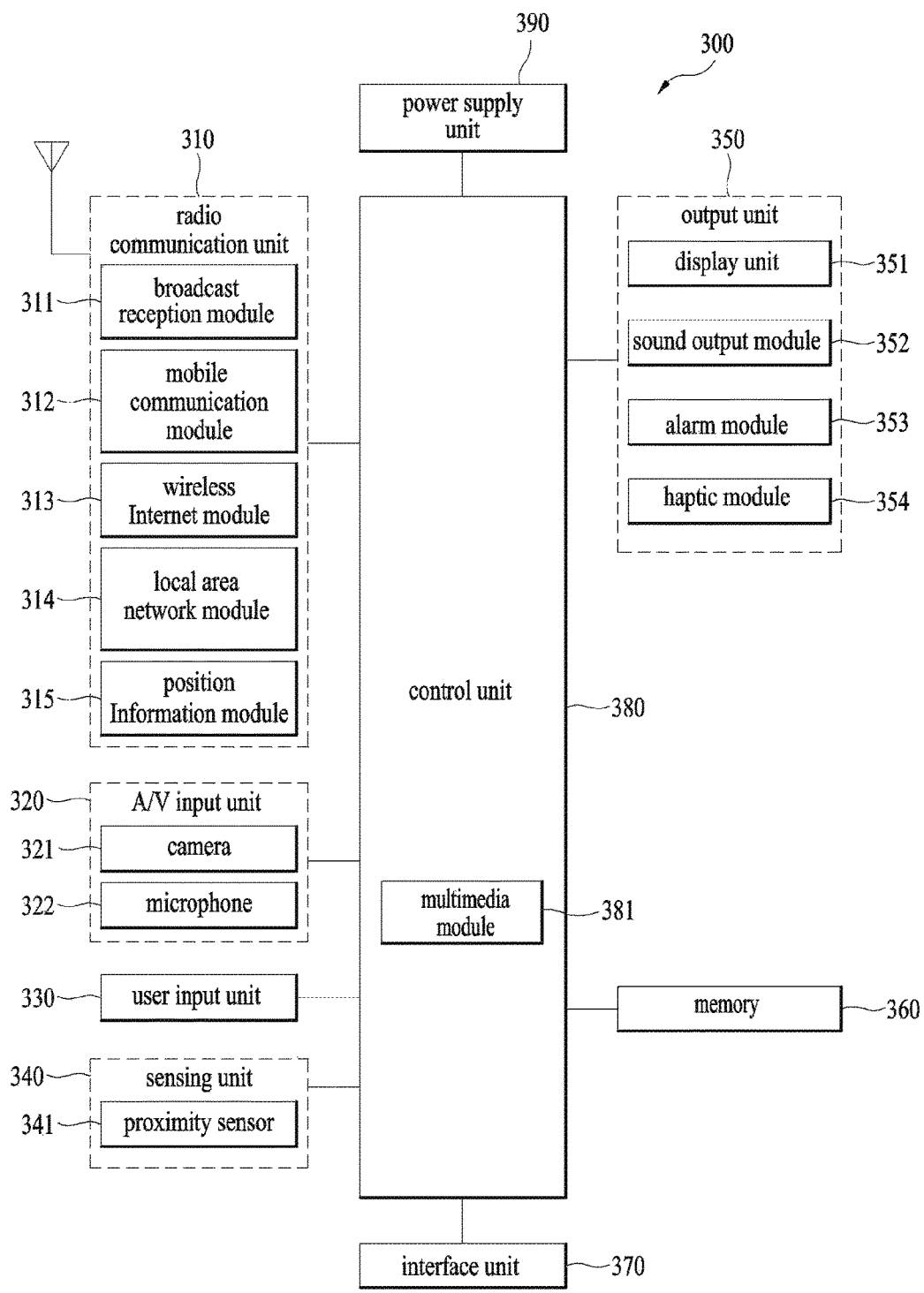
FIG. 3 is a block diagram illustrating a digital device according to another embodiment of the present invention.

FIG. 2 is a schematic diagram of a digital receiver according to an embodiment of the present invention.

The digital receiver 200 may correspond to the client 100 shown in FIG. 1.

The digital receiver 200 may include a network interface 201, a TCP/IP manager 202, a service delivery manager 203, an SI (System Information, Service Information or Signaling Information) decoder 204, a demultiplexer 205, an audio decoder 206, a video decoder 207, a display A/V and OSD (On Screen Display) module 208, a service control manager 209, a service discovery manager 210, a SI & metadata database (DB) 211, a metadata manager 212, an application manager, etc.

The network interface 201 may receive or transmit IP packets including service data through a network. In other words, the network interface 201 may receive IP packets including at least one of text data, image data, audio data, and video data, used for SNS, as well as services and applications from a server connected thereto through a network.

The TCP/IP manager 202 may involve delivery of IP packets transmitted to the digital receiver 200 and IP packets transmitted from the digital receiver 200, that is, packet delivery between a source and a destination. The TCP/IP manager 202 may classify received packets according to an appropriate protocol and output the classified packets to the service delivery manager 205, the service discovery manager 210, the service control manager 209, and the metadata manager 212.

The service delivery manager 203 may control classification and processing of service data. The service delivery manager 203 may control real-time streaming data, for example, using real-time protocol/real-time control protocol (RTP/RTCP). In other words, the service delivery manager 203 may parse a real-time streaming data packet, transmitted on the basis of the RTP, according to the RTP and transmits the parsed data packet to the demultiplexer 205 or store the parsed data packet in the SI & metadata DB 211 under the control of the service manager 213. The service delivery manager 203 can feed back network reception information to the server on the basis of the RTP.

The demultiplexer 205 may demultiplex audio data, video data, SI from a received packet through packet identifier (PID) filtering and transmit the demultiplexed data to corresponding processors, that is, the audio/video decoder 206/207 and the SI decoder 204.

The SI decoder 204 may parse and/or decode SI data such as program specific information (PSI), program and system information protocol (PSIP), digital video broadcast-service information (DVB-SI), etc. The SI decoder 204 may store the parsed and/or decoded SI data in the SI & metadata DB 211. The SI data stored in the SI & metadata DB 211 can be read or extracted and used by a component which requires the SI data. EPG data can also be read from the SI & metadata DB 211. This will be described below in detail.

The audio decoder 206 and the video decoder 207 respectively may decode audio data and video data, which are demultiplexed by the demultiplexer 205. The decoded audio data and video data may be provided to the user through the display unit 208.

The application manager may include a service manager 213 and a user interface (UI) manager 214, administrate the overall state of the digital receiver 200, provides a UI, and manage other mangers.

The UI manager 214 can receive a key input from the user and provide a graphical user interface (GUI) related to a receiver operation corresponding to the key input through OSD.

The service manager 213 may control and manage service-related managers such as the service delivery manager 203, the service discovery manager 210, the service control manager 209, and the metadata manager 212.

The service manager 213 may configure a channel map and enable channel control at the request of the user on the basis of the channel map. The service manager 213 may receive service information corresponding to channel from the SI decoder 204 and set audio/video PID of a selected channel to the demultiplexer 205 so as to control the demultiplexing procedure of the demultiplexer 205.

The service discovery manager 210 may provide information required to select a service provider that provides a service. Upon receipt of a signal for selecting a channel from the service manager 213, the service discovery manager 210 discovers a service on the basis of the received signal.

The service control manager 209 may select and control a service. For example, the service control manager 209 may perform service selection and control using IGMP (Internet Group Management Protocol) or real time streaming protocol (RTSP) when the user selects a live broadcast service and using RTSP when the user selects a video on demand (VOD) service.

The metadata manager 212 may manage metadata regarding services and store metadata in the SI & metadata DB 211.

The SI & metadata DB 211 may store SI data decoded by the SI decoder 204, metadata managed by the metadata manager 212, and information required to select a service provider, which is provided by the service discovery manager 210. In addition, the SI & metadata DB 211 can store system set-up data.

The SI & metadata DB 211 can be implemented using a Non-Volatile RAM (NVRAM) or a Flash memory, and the like.

An IMS (IP Multimedia Subsystem) gateway 250 may include functions required to access an IMS based IPTV services.

FIG. 3 is a block diagram showing the configuration of a digital device according to another embodiment of the present invention;

FIG. 3 shows the mobile terminal 300 having various components, but it is understood that implementing all of the illustrated components is not a requirement. More or fewer components may be implemented according to various embodiments.

With reference to FIG. 3, the mobile terminal 300 includes a wireless communication unit 310, an A/V (audio/video) input unit 320, an user input unit 330, a sensing unit 340, an output unit 350, a memory 360, an interface unit 370, a controller 380, and a power supply unit 390.

The detailed description of each component is as follows.

The wireless communication unit 310 typically includes one or more components which permit wireless communication between the mobile terminal 300 and a wireless communication system or network within which the mobile terminal 300 is located. For instance, the wireless communication unit 310 can include a broadcast receiving module 311, a mobile communication module 312, a wireless Internet module 313, a short-range communication module 314, and a position-location module 315.

The broadcast receiving module 311 receives a broadcast signal and/or broadcast associated information from an external broadcast managing server via a broadcast channel. The broadcast channel may include a satellite channel and a terrestrial channel. At least two broadcast receiving modules 311 can be provided in the mobile terminal 300 to facilitate simultaneous reception of at least two broadcast channels or broadcast channel switching.

The broadcast associated information includes information associated with a broadcast channel, a broadcast program, or a broadcast service provider. Furthermore, the broadcast associated information can be provided via a mobile communication network. In this case, the broadcast associated information can be received by the mobile communication module 312.

The broadcast associated information can be implemented in various forms. For instance, broadcast associated information may include an electronic program guide (EPG) of digital multimedia broadcasting (DMB) and an electronic service guide (ESG) of digital video broadcast-handheld (DVB-H).

The broadcast receiving module 311 may be configured to receive broadcast signals transmitted from various types of broadcast systems. By non-limiting example, such broadcasting systems may include digital multimedia broadcasting-terrestrial (DMB-T), digital multimedia broadcasting-satellite (DMB-S), digital video broadcast-handheld (DVB-H), digital video broadcast-convergence of broadcasting and mobile services (DVB-CBMS), Open Mobile Alliance Broadcast (OMA-BCAST), the data broadcasting system known as media forward link only (MediaFLO™) and integrated services digital broadcast-terrestrial (ISDB-T). Optionally, the broadcast receiving module 311 can be configured to be suitable for other broadcasting systems as well as the above-noted digital broadcasting systems.

The broadcast signal and/or broadcast associated information received by the broadcast receiving module 311 may be stored in a suitable device, such as the memory 360.

The mobile communication module 312 transmits/receives wireless signals to/from one or more network entities (e.g., a base station, an external terminal, and/or a server) via a mobile network such as GSM (Global System for Mobile communications), CDMA (Code Division Multiple Access), or WCDMA (Wideband CDMA). Such wireless signals may carry audio, video, and data according to text/multimedia messages.

The wireless Internet module 313 supports Internet access for the mobile terminal 300. This module may be internally or externally coupled to the mobile terminal 300. The wireless Internet technology can include WLAN (Wireless LAN), Wi-Fi, Wibro™ (Wireless broadband), Wimax™ (World Interoperability for Microwave Access), HSDPA (High Speed Downlink Packet Access), GSM, CDMA, WCDMA, or LTE (Long Term Evolution).

The short-range communication module 314 facilitates relatively short-range communications. Suitable technologies for implementing this module include radio frequency identification (RFID), infrared data association (IrDA), ultra-wideband (UWB), as well as the networking technologies commonly referred to as Bluetooth™ and ZigBee™, to name a few.

The position-location module 315 identifies or otherwise obtains the location of the mobile terminal 100. According to one embodiment, this module may be implemented with a global positioning system (GPS) module.

With continued reference to FIG. 3, the audio/video (A/V) input unit 320 is configured to provide audio or video signal input to the mobile terminal 300. As shown, the A/V input unit 320 includes a camera 321 and a microphone 322. The camera 321 receives and processes image frames of still pictures or video, which are obtained by an image sensor in a video call mode or a photographing mode. Furthermore, the processed image frames can be displayed on the display 351.

The image frames processed by the camera 321 can be stored in the memory 360 or can be transmitted to an external recipient via the wireless communication unit 310. Optionally, at least two cameras 321 can be provided in the mobile terminal 300 according to the environment of usage.

The microphone 322 receives an external audio signal while the portable device is in a particular mode, such as phone call mode, recording mode and voice recognition. This audio signal is processed and converted into electronic audio data. The processed audio data is transformed into a format transmittable to a mobile communication base station via the mobile communication module 312 in a call mode. The microphone 322 typically includes assorted noise removing algorithms to remove noise generated in the course of receiving the external audio signal.

The user input unit 330 generates input data responsive to user manipulation of an associated input device or devices. Examples of such devices include a keypad, a dome switch, a touchpad (e.g., static pressure/capacitance), a jog wheel, and a jog switch.

The sensing unit 340 provides sensing signals for controlling operations of the mobile terminal 300 using status measurements of various aspects of the mobile terminal. For instance, the sensing unit 340 may detect an open/closed status of the mobile terminal 100, the relative positioning of components (e.g., a display and keypad) of the mobile terminal 300, a change of position (or location) of the mobile terminal 300 or a component of the mobile terminal 300, a presence or absence of user contact with the mobile terminal 300, and an orientation or acceleration/deceleration of the mobile terminal 300. As an example, a mobile terminal 300 configured as a slide-type mobile terminal is considered. In this configuration, the sensing unit 340 may sense whether a sliding portion of the mobile terminal is open or closed. According to other examples, the sensing unit 340 senses the presence or absence of power provided by the power supply unit 390, and the presence or absence of a coupling or other connection between the interface unit 370 and an external device. According to one embodiment, the sensing unit 340 can include a proximity sensor 341.

The output unit 350 generates output relevant to the senses of sight, hearing, and touch. Furthermore, the output unit 350 includes the display 351, an audio output module 352, an alarm unit 353, a haptic module 354, and a projector module 355.

The display 351 is typically implemented to visually display (output) information associated with the mobile terminal 300. For instance, if the mobile terminal is operating in a phone call mode, the display will generally provide a user interface (UI) or graphical user interface (GUI) which includes information associated with placing, conducting, and terminating a phone call. As another example, if the mobile terminal 300 is in a video call mode or a photographing mode, the display 351 may additionally or alternatively display images which are associated with these modes, the UI or the GUI.

The display module 351 may be implemented using known display technologies. These technologies include, for example, a liquid crystal display (LCD), a thin film transistor-liquid crystal display (TFT-LCD), an organic light-emitting diode display (OLED), a flexible display and a three-dimensional display. The mobile terminal 300 may include one or more of such displays.

Some of the displays can be implemented in a transparent or optical transmittive type, i.e., a transparent display. A representative example of the transparent display is the TOLED (transparent OLED). A rear configuration of the display 351 can be implemented as the optical transmittive type as well. In this configuration, a user may be able to see an object located at the rear of a terminal body on a portion of the display 351 of the terminal body.

At least two displays 351 can be provided in the mobile terminal 300 in accordance with one embodiment of the mobile terminal 300. For instance, a plurality of displays can be arranged to be spaced apart from each other or to form a single body on a single face of the mobile terminal 300. Alternatively, a plurality of displays can be arranged on different faces of the mobile terminal 300.

If the display 351 and a sensor for detecting a touch action (hereinafter called 'touch sensor') are configured as a mutual layer structure (hereinafter called 'touch screen'), the display 351 is usable as an input device as well as an output device. In this case, the touch sensor can be configured as a touch film, a touch sheet, or a touchpad.

The touch sensor can be configured to convert pressure applied to a specific portion of the display 351 or a variation of capacitance generated from a specific portion of the display 351 to an electronic input signal. Moreover, the touch sensor is configurable to detect pressure of a touch as well as a touched position or size.

If a touch input is made to the touch sensor, a signal(s) corresponding to the touch input is transferred to a touch controller. The touch controller processes the signal(s) and then transfers the processed signal(s) to the controller 380. Therefore, the controller 380 is made aware when a prescribed portion of the display 351 is touched.

Referring to FIG. 3, a proximity sensor 341 can be provided at an internal area of the mobile terminal 300 enclosed by the touch screen or around the touch screen. The proximity sensor is a sensor that detects a presence or non-presence of an object approaching a prescribed detecting surface or an object existing (or located) around the proximity sensor using an electromagnetic field strength or infrared ray without mechanical contact. Hence, the proximity sensor 341 is more durable than a contact type sensor and also has utility broader than the contact type sensor.

The proximity sensor 341 can include one of a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, and an infrared proximity sensor. If the touch screen includes the electrostatic capacity proximity sensor, it is configured to detect the proximity of a pointer using a variation of an electric field according to the proximity of the pointer. In this configuration, the touch screen (touch sensor) can be considered as the proximity sensor.

For clarity and convenience of explanation, an action for enabling the pointer approaching the touch screen to be recognized as placed on the touch screen may be named 'proximity touch' and an action of enabling the pointer to actually come into contact with the touch screen may named 'contact touch'. And, a position, at which the proximity touch is made to the touch screen using the pointer, may mean a position of the pointer vertically corresponding to the touch screen when the pointer makes the proximity touch.

The proximity sensor detects a proximity touch and a proximity touch pattern (e.g., a proximity touch distance, a proximity touch duration, a proximity touch position, a proximity touch shift state). Information corresponding to the detected proximity touch action and the detected proximity touch pattern can be output to the touch screen.

The audio output module 352 functions in various modes including a call-receiving mode, a call-placing mode, a recording mode, a voice recognition mode, and a broadcast reception mode to output audio data which is received from the wireless communication unit 310 or is stored in the memory 360. During operation, the audio output module 352 outputs audio relating to a particular function (e.g., call received, message received). The audio output module 352 may be implemented using one or more speakers, buzzers, other audio producing devices, and combinations of these devices.

The alarm unit 353 outputs a signal for announcing the occurrence of a particular event associated with the mobile terminal 300. Typical events include a call received, a message received and a touch input received. The alarm unit 353 is able to output a signal for announcing the event occurrence by way of vibration as well as video or audio signal. The video or audio signal can be output via the display 351 or the audio output module 352. Hence, the display 351 or the audio output module 352 can be regarded as a part of the alarm unit 353.

The haptic module 354 generates various tactile effects that can be sensed by a user. Vibration is a representative one of the tactile effects generated by the haptic module 354. The strength and pattern of the vibration generated by the haptic module 354 are controllable. For instance, different vibrations can be output in a manner of being synthesized together or can be output in sequence. The haptic module 354 is able to generate various tactile effects as well as the vibration. For instance, the haptic module 354 may generate an effect attributed to the arrangement of pins vertically moving against a contact skin surface, an effect attributed to the injection/suction power of air though an injection/suction hole, an effect attributed to the skim over a skin surface, an effect attributed to a contact with an electrode, an effect attributed to an electrostatic force, and an effect attributed to the representation of a hot/cold sense using an endothermic or exothermic device. The haptic module 354 can be implemented to enable a user to sense the tactile effect through a muscle sense of a finger or an arm as well as to transfer the tactile effect through direct contact. Optionally, at least two haptic modules 354 can be provided in the mobile terminal 300 in accordance with an embodiment of the mobile terminal 300.

The memory 360 is generally used to store various types of data to support the processing, control, and storage requirements of the mobile terminal 300. Examples of such data include program instructions for applications operating on the mobile terminal 300, contact data, phonebook data, messages, audio, still pictures (or photo), and moving pictures. Furthermore, a recent use history or a cumulative use frequency of each data (e.g., use frequency for each phonebook, each message or each multimedia file) can be stored in the memory 360. Moreover, data for various patterns of vibration and/or sound output in response to a touch input to the touch screen can be stored in the memory 360.

The memory 360 may be implemented using any type or combination of suitable volatile and non-volatile memory or storage devices including hard disk, random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, multimedia card micro type memory, card-type memory (e.g., SD memory or XD memory), or other similar memory or data storage device. Furthermore, the mobile terminal 300 is able to operate in association with a web storage for performing a storage function of the memory 360 on the Internet.

The interface unit 370 may be implemented to couple the mobile terminal 100 with external devices. The interface unit 370 receives data from the external devices or is supplied with power and then transfers the data or power to the respective elements of the mobile terminal 300 or enables data within the mobile terminal 300 to be transferred to the external devices. The interface unit 370 may be configured using a wired/wireless headset port, an external charger port, a wired/wireless data port, a memory card port, a port for coupling to a device having an identity module, audio input/output ports, video input/output ports, and/or an earphone port.

The identity module is a chip for storing various kinds of information for authenticating a usage authority of the mobile terminal 300 and can include a User Identify Module (UIM), a Subscriber Identity Module (SIM), and/or a Universal Subscriber Identity Module (USIM). A device having the identity module (hereinafter called 'identity device') can be manufactured as a smart card. Therefore, the identity device is connectible to the mobile terminal 300 via the corresponding port.

When the mobile terminal 300 is connected to an external cradle, the interface unit 370 becomes a passage for supplying the mobile terminal 300 with a power from the cradle or a passage for delivering various command signals input from the cradle by a user to the mobile terminal 300. Each of the various command signals input from the cradle or the power can operate as a signal enabling the mobile terminal 300 to recognize that it is correctly loaded in the cradle.

The controller 380 typically controls the overall operations of the mobile terminal 300. For example, the controller 380 performs the control and processing associated with voice calls, data communications, and video calls. The controller 380 may include a multimedia module 381 that provides multimedia playback. The multimedia module 381 may be configured as part of the controller 380, or implemented as a separate component. Moreover, the controller 380 is able to perform a pattern (or image) recognizing process for recognizing a writing input and a picture drawing input carried out on the touch screen as characters or images, respectively.

The power supply unit 390 provides power required by various components of the mobile terminal 300. The power may be internal power, external power, or combinations of internal and external power.

Various embodiments described herein may be implemented in a computer-readable medium using, for example, computer software, hardware, or some combination of computer software and hardware.

For a hardware implementation, the embodiments described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof. Such embodiments may also be implemented by the controller 180.

For a software implementation, the embodiments described herein may be implemented with separate software modules, such as procedures and functions, each of which performs one or more of the functions and operations described herein. The software codes can be implemented with a software application written in any suitable programming language and may be stored in memory such as the memory 160, and executed by a controller or processor, such as the controller 380.

Figure 4:
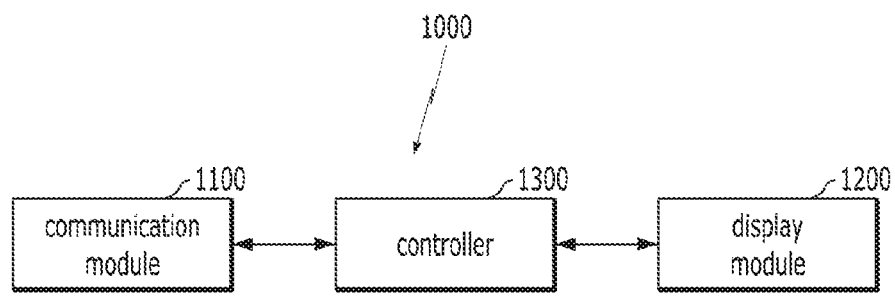
FIG. 4 is a block diagram illustrating a digital device according to a further embodiment of the present invention.

FIG. 4 is a block diagram illustrating a digital device according the present invention.

Referring to FIG. 4, a digital device 100 may include a communication module 1100, a display module 1200, and a controller 1300.

In this case, the communication module 1100 may be configured to receive an image signal wirelessly or via a wire.

For example, the communication module 1100 may be connected to Wi-Fi Direct to perform device-to-device wireless communication. In addition, the communication module 1100 may be connected to various kinds of wireless communication systems such as Wi-Fi, Bluetooth, infrared communication, near field communication (NFC), etc. as well as Wi-Fi Direct.

The display module 1200 may be configured to display a signal-processed image after signal processing is performed on the received image signal In this case, the display module 1200 may include a display panel and a light source module for emitting light to the display panel.

The controller 1300 may be configured to control operation of the digital device 100. That is, the controller 1300 controls overall operation of at least one module including the communication module 1100 and the display module 1200.

In particular, the controller 1300 may perform a preprocessing process as follows. The controller 1300 separates a received image signal into a plurality of frequency bands, adjusts gains of image signals separated into the plurality of the frequency bands, synthesizes the image signals of the individual frequency bands in which the gains are adjusted, and displays an enhanced image on a screen. Thereafter, the controller 1300 may perform a post processing process as follows. The controller 1300 divides the screen on which the enhanced image is displayed into a plurality of areas. Next, if a maximum pixel value of the enhanced image displayed on the divided screen areas is greater than a reference value, the controller 1300 may adjust a pixel value of the enhanced image displayed on the divided screen areas.

The digital device according to the present invention may include a light source module composed of a plurality of light sources. In this case, brightness of each light source can be adjusted according to maximum brightness of a displayed image. Thus, it is possible to reduce power consumption.

In this case, each light source is in charge of luminance of a partial screen area. Thus, brightness can be adjusted according to a maximum pixel value of the corresponding area.

The brightness of the light source module is determined according to maximum pixel values of partial screen areas controlled by the respective light sources rather than a maximum pixel value of a full screen area.

That is, power consumption can be efficiently reduced by adjusting the brightness of each light source instead of adjusting the total brightness of the light source module.

According to the present invention, to reduce power consumption, the screen is divided into a plurality of areas and then brightness of each light source is separately adjusted according to a maximum pixel value of each of the divided areas.

However, when the brightness of each light source is separately adjusted, the light source module may operate with low power and thus, a dynamic range may be reduced. Moreover, in this case, contrast may be reduced and detail information may disappear.

According to the present invention, it is possible to generate an enhanced image by improving sharpness and contrast through the preprocessing process and adjust a maximum pixel value of the enhanced image not to be greater than that of an original image through the post processing process, thereby minimizing image quality degradation while reducing power consumption using the local dimming scheme for adjusting brightness of each light source.

The controller 1300 may separate an image into a plurality of frequency bands through the preprocessing process and adjust contrast, sharpness, intensity and the like of the image based on characteristics of the respective frequency bands.

For example, in the separated frequency bands, a high frequency component may significantly affect sharpness of an image, a middle frequency component may affect contrast of the image, and a low frequency component may affect total brightness of the image.

Thus, during the preprocessing process, the controller 1300 may separate the image into the plurality of the frequency bands, adjust gains in the respective frequency bands, synthesize the respective frequency bands in which the gains are adjusted, and then adjust the sharpness and contrast of the image in order to improve image quality.

In addition, the controller 1300 may perform the local dimming scheme during the post processing process. That is, when the maximum pixel value of the enhanced image displayed on the divided screen areas is greater than that of the original image, the controller 1300 may adjust the maximum pixel value of the enhanced image to minimize the image quality degradation and reduce the power consumption.

Figure 5:
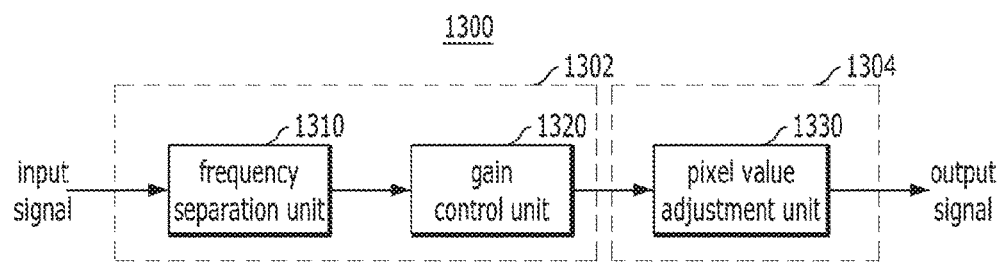
FIG. 5 is a block diagram illustrating a detailed configuration of the controller of FIG. 4.

FIG. 5 is a block diagram illustrating a detailed configuration of the controller of FIG. 4.

Referring to FIG. 5, the controller 1300 can be mainly divided into a preprocessing unit 1302 and a post processing unit 1304.

In this case, the preprocessing unit 1302 may include a frequency separation unit 1310 and a gain control unit 1320 and the post processing unit 1304 may include a pixel value adjustment unit 1330.

The frequency separation unit 1310 may separate a received image signal into a plurality of frequency bands.

For example, the frequency separation unit 1310 may include a filter unit, a first calculation unit, and a second calculation unit. In this case, the filter unit may be configured to perform filtering on the received image signal into the plurality of the frequency bands. The first calculation unit may be configured to calculate a high frequency component in each frequency band by calculating difference values between the received image signal and the filtered image signals of the respective frequency bands. The second calculation unit may be configured to calculate a final frequency signal in each frequency band by calculating difference values between high frequency components of adjacent frequency bands.

In addition, the frequency separation unit 1310 may separate the received image signal into four frequency bands: a high frequency band; a mid-high frequency band; a mid-low frequency band; and a low frequency band.

The reason for why the frequency separation unit 1310 separates the image signal into the plurality of the frequency bands is that since the individual frequency bands have different influences on the image, individual frequency components need to be processed in a different manner.

For example, a high frequency component may significantly affect sharpness of an image, a middle frequency component may affect contrast of the image, and a low frequency component may affect total brightness of the image.

The gain control unit 1320 may be configured to adjust gains of the image signals separated into the individual frequency bands, synthesize the image signals of the individual frequency bands in which the gains are adjusted, and control the display module to display an enhanced image on a screen.

For example, the gain control unit 1320 may include a high frequency gain determination unit and a high frequency gain adjustment unit. Specifically, if a separated frequency band is a high frequency band, the high frequency gain determination unit may be configured to perform normalization by calculating a local variance value of each pixel in the original image of the received image signal and determine a gain value based on the normalized local variance value. In addition, the high frequency gain adjustment unit may be configured to adjust a gain of the image signal of the high frequency band based on the determined gain value.

Moreover, the high frequency gain adjustment unit may be configured to increase the gain in an area where a detail component of the original image is lower than a predetermined value and not to increase the gain in an area where the detail component of the original image is higher than the predetermined value.

That is, in some cases, the gain control unit 1320 may include the high frequency gain determination unit and the high frequency gain adjustment unit. Specifically, when a separated frequency band is the high frequency band, the high frequency gain determination unit may be configured to perform the normalization by calculating the local variance value of each pixel in the original image of the received image signal and determine the gain value based on the normalized local variance value. In addition, the high frequency gain adjustment unit may be configured to adjust the gain of the image signal of the high frequency band based on the determined gain value.

Moreover, the gain control unit 1320 may include a mid-frequency gain calculation unit and a mid-frequency gain adjustment unit. Specifically, if a separated frequency band is a mid-frequency band, the mid-frequency gain calculation unit may be configured to divide the mid-frequency band into a mid-high frequency band and a mid-low frequency band and calculate gain values of the divided mid-high frequency band and mid-low frequency band. The mid-frequency gain adjustment unit may be configured to check whether a difference between the calculated gain value of the mid-high frequency band and the calculated gain value of the mid-low frequency band is higher than a reference value. In addition, when the difference between the calculated gain value of the mid-high frequency band and the calculated gain value of the mid-low frequency band is higher than the reference value, the mid-frequency gain adjustment unit may be configured to adjust the gain value of the mid-high frequency band or the gain value of the mid-low frequency band.

Furthermore, the gain control unit 1320 may include a first compensation unit, a second compensation unit, and a block unit. In this case, if a separated frequency band is a low frequency band, the first compensation unit may be configured to compensate by increasing a pixel value of the low frequency band image at a first rate. The second compensation unit may be configured to check whether the pixel value increased at the first rate reaches a predetermined threshold value. In addition, when the pixel value increased at the first rate reaches the predetermined threshold value, the second compensation unit may be configured to compensate by further increasing the pixel value at a second rate. The block unit may be configured to check whether the pixel value increased at the second rate reaches the maximum pixel value of the original image. When the pixel value increased at the second rate reaches the maximum pixel value of the original image, the block unit may be configured to block increase of the pixel value.

In this case, the first rate may be an increase rate with a straight line slope and the second rate may be an increase rate with a curved line slope.

As described above, since the individual frequency bands have different image characteristics, the gain control unit 1320 can obtain the enhanced image with improved image quality by adjusting gain values in a different manner.

The pixel value adjustment unit 1330 may be configured to divide a screen of the displayed module on which the enhanced image is displayed into a plurality of areas and check whether the maximum pixel value of the enhanced image displayed on the divided screen areas is greater than a reference value. In addition, when the maximum pixel value of the enhanced image is greater than the reference value, the pixel value adjustment unit 1330 may be configured to adjust a pixel value of the enhanced image displayed on the divided screen areas.

In this case, when dividing the screen on which the enhanced image is displayed into the plurality of the areas, the pixel value adjustment unit 1330 may determine each of the divided screen areas as a screen area that is managed by a single light source among a plurality of light resources included in a light source module.

For example, the pixel value adjustment unit 1330 may determine each of the divided screen areas as a screen area where about 16 pixel lines are arranged. However, the present invention is not limited thereto.

In addition, when checking whether the maximum pixel value of the enhanced image displayed on the divided screen areas is greater than the reference value, the pixel value adjustment unit 1330 may determine the maximum pixel value of the original image as the reference value.

Moreover, the pixel value adjustment unit 1330 may include a first adjustment unit, a second adjustment unit, and a third adjustment unit. In this case, when the maximum pixel value of the enhanced image is greater than the reference value, the first adjustment unit may be configured to determine the maximum pixel value of the enhanced image, which is greater than the reference value, as a new reference value. The second adjustment unit may be configured to adjust pixel values equal to or lower than a predetermined threshold value among pixel values of the enhanced image to be increased at a first rate. The third adjustment unit may be configured to adjust pixel values higher than the predetermined threshold value among the pixel values of the enhanced image to be increased at a second rate.

In this case, the first rate may be an increase rate with a straight line slope and the second rate may be an increase rate with a curved line slope.

That is, if the maximum pixel value of the enhanced image is greater than that of the original image, it may cause additional power consumption. Therefore, the pixel value adjustment unit 1330 may adjust the maximum pixel value of the enhanced image such that it does not exceed the maximum pixel value of the original image.

Furthermore, when the maximum pixel value of the enhanced image is greater than that of the original image, the pixel value adjustment unit 1330 may adjust the maximum pixel value of the enhanced image to be equal to that of the original image. However, in this case, if saturation occurs in a bright part, detail information may disappear.

Therefore, the pixel value adjustment unit 1330 may adjust pixel values between the predetermined threshold value and the maximum pixel value of the enhanced image to be increased with a curved-line slope in order to prevent the detail information from disappearing in the bright part.

Accordingly, even when the power consumption is minimized, the quality of the enhanced image may be almost equal to that of the original image.

Further, the pixel value adjustment unit 1330 may further include a fourth adjustment unit. In this case, when a maximum pixel value of a first screen area among the divided screen areas is different from that of a second screen area which is adjacent to the first screen area, the fourth adjustment unit may be configured to adjust maximum pixel values of pixels located at a boundary between the first and second screen areas in a gradient manner.

Additionally, when the maximum pixel value of the first screen area is greater than that of the second screen area, the fourth adjustment unit may increase the maximum pixel values of the pixels located at the boundary between the first and second screen areas such that the values are gradually increased from the second screen area to the first screen area in a gradient manner.

In other words, in case the full screen is divided into the plurality of the screen areas, if the maximum pixel value of the first screen area is different from that of the second screen area adjacent to the first screen area, there may be image noise such as a line artifact at the boundary therebetween.

Therefore, to cancel the image noise, the pixel value adjustment unit 1330 may gradually increase the maximum pixel values of the pixels located at the boundary between the first and second screen areas in a gradient manner.

According to the present invention, it is possible to minimize image quality degradation and reduce power consumption by performing the preprocessing process for improving contrast and sharpness of an image and the post processing process for dividing a screen into a plurality of screen areas and adjusting maximum pixel values of the divided screen areas.

Figure 6:
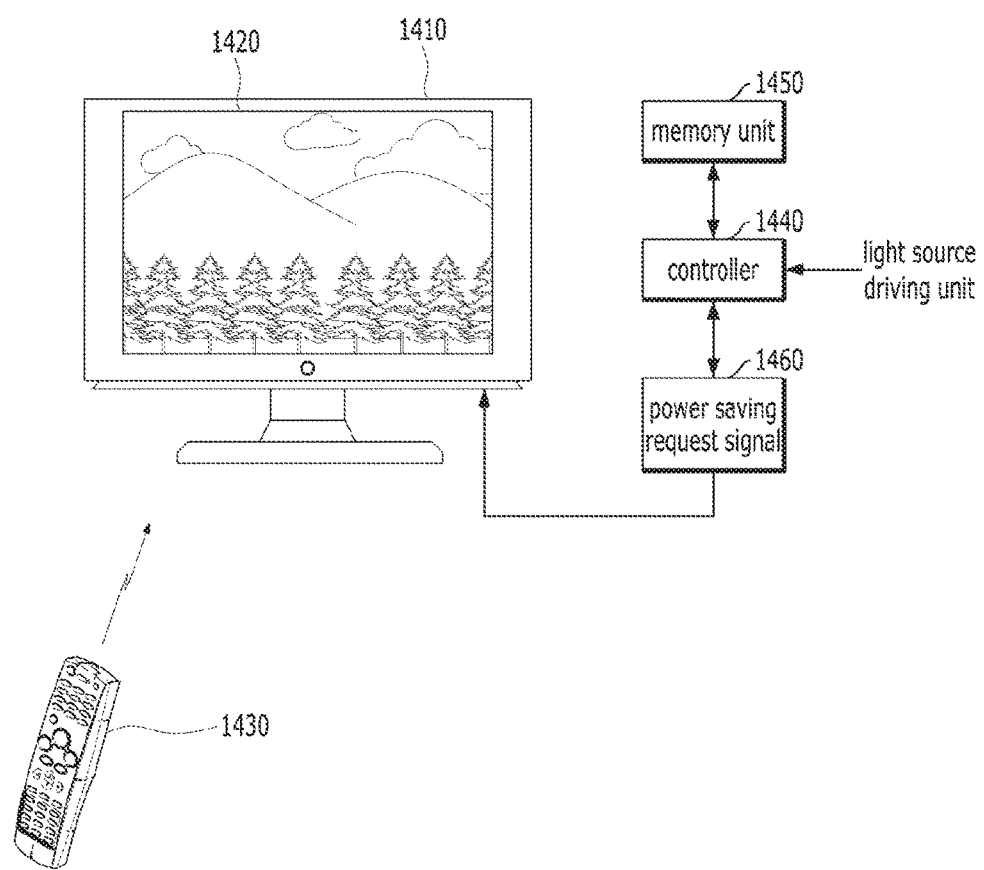
FIGS. 6 to 8 are diagram illustrating operation of the digital device according to a power saving request.
Figure 7:
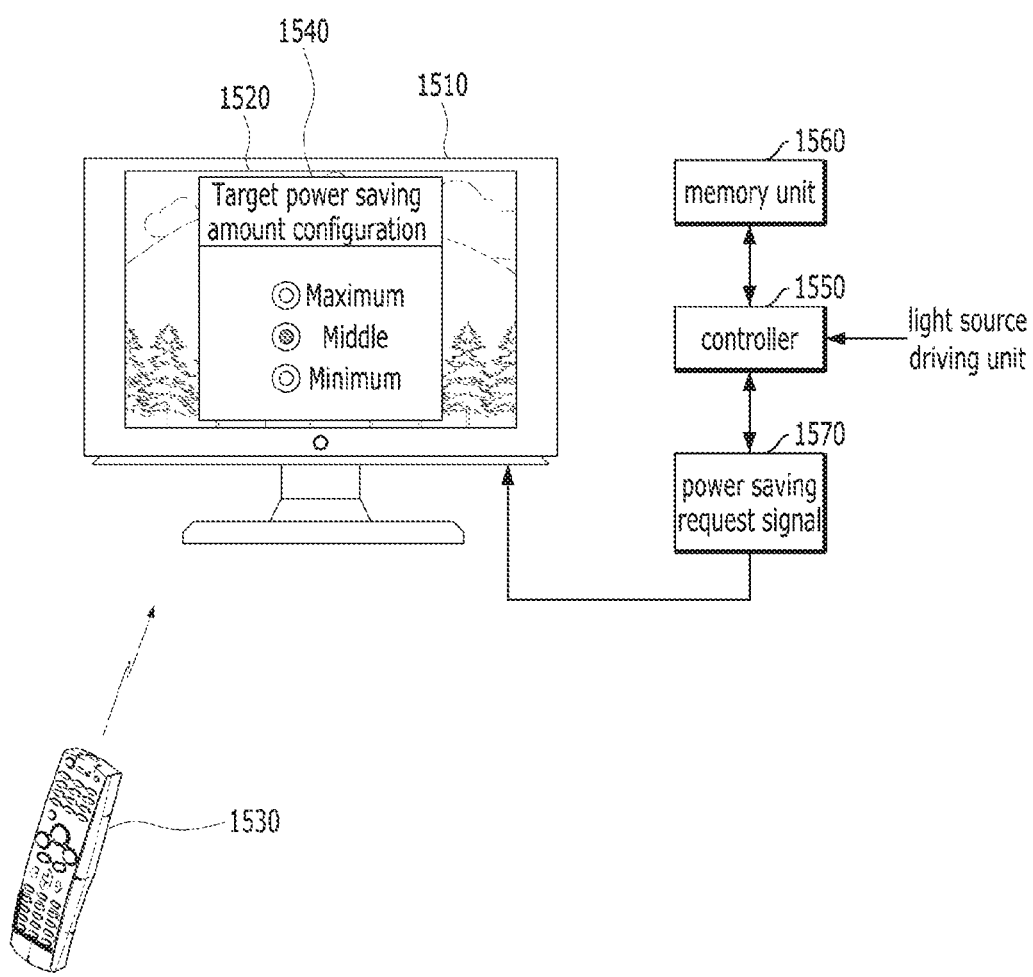
Figure 8:
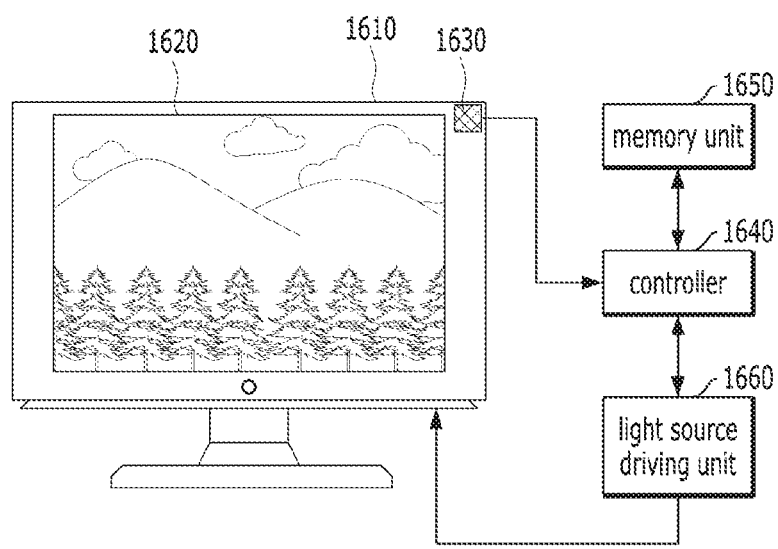

FIGS. 6 to 8 are diagram illustrating operation of the digital device according to a power saving request. Specifically, FIG. 6 shows operations of a controller according to a power saving request from a remote controller. FIG. 7 shows operations of a controller according to a signal selected in a window for configuring a target power saving amount. FIG. 8 shows operation of a controller according to a sensing signal from a sensor that senses outside brightness.

As shown in FIG. 6, if a digital device 1410 receives a power saving request signal, which is transmitted by a user through a remote controller 1430, while displaying an image on a screen 1420, a controller 1440 of the digital device 1410 may perform the preprocessing process and the post processing process on the image to reduce power consumption according to the received power saving request signal.

In this case, the controller 1440 may perform the preprocessing process and the post processing process on the image by controlling a light source driving unit 1460 based on predetermined information stored in a memory unit 1450.

That is, when receiving the power saving request signal from the outside, the controller 1440 may separate a received image signal into a plurality of frequency bands in order to perform image processing.

In some cases, as shown in FIG. 7, if a digital device 1510 receives a power saving request signal, which is transmitted by a user through a remote controller 1530, while displaying an image on a screen 1520, a controller 1550 of the digital device 1510 may display a target power saving amount configuration window 1540 on the screen 1520 according to the received power saving request signal.

In this case, the target power saving amount configuration window 1540 may include not only a target power saving amount configuration option but also a plurality of options for selecting a target power saving amount.

In addition, if the user selects any option from among the options displayed on the target power saving amount configuration window 1540 through the remote controller 1530, the controller 1550 may perform the preprocessing process and the post processing process on the image to reduce power consumption according to the power saving selection signal.

In this case, the controller 1550 may perform the preprocessing process and the post processing process on the image by controlling a light source driving unit 1570 based on predetermined information stored in a memory unit 1560.

That is, when receiving the power saving request signal from the outside, the controller 1550 may determine a target power saving amount based on the received power saving request signal and separate a received image signal into a plurality of frequency bands based on the determined target power saving amount in order to perform image processing.

In this case, when determining the target power saving amount based on the received power saving request signal, the controller 1550 may generate the target power saving amount configuration window 1540, display the generated target power saving amount configuration window 1540 on the screen of the display module, receive the target power saving amount through the displayed target power saving amount configuration window 1540 from the user, and separate a received image signal into a plurality of frequency bands based on the target power saving amount in order to perform image processing.

As another example, as shown in FIG. 8, while a digital device displays an image on a screen 1620, a sensor 1630 may sense outside brightness In addition, a controller 1640 of the digital device 1610 receives a sensing signal associated with the outside brightness from the sensor 1630 and analyzes the sensing signal. When the outside brightness is within a predetermined brightness range, the controller 1640 may perform the preprocessing process and the post processing process on the image to reduce power consumption.

In this case, the controller 1640 may perform the preprocessing process and the post processing process on the image by controlling a light source driving unit 1660 based on predetermined information stored in a memory unit 1650.

That is, the controller 1640 may separate a received image signal into a plurality of frequency bands based on the outside brightness in order to perform image processing.

Figure 9:
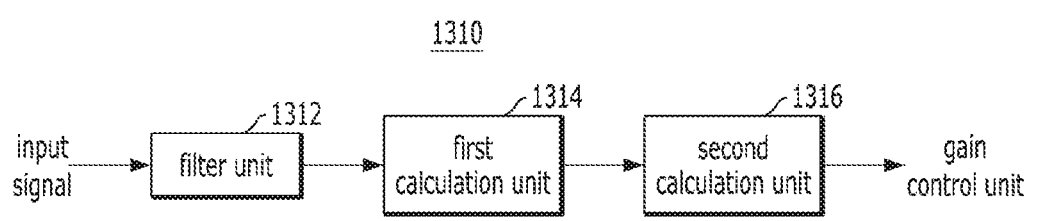
FIGS. 9 and 10 are block diagrams illustrating the frequency separation unit of FIG. 5.
Figure 10:
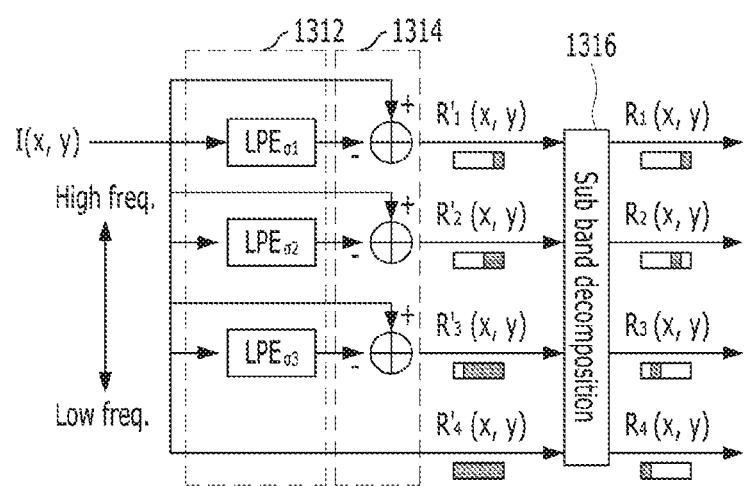

FIGS. 9 and 10 are block diagrams illustrating the frequency separation unit of FIG. 5.

As shown in FIGS. 9 and 10, the frequency separation unit 1310 may include a filter unit 1312, a first calculation unit 1314, and a second calculation unit 1316.

In this case, the filter unit 1312 may be configured to perform filtering on a received image signal into a plurality of frequency bands and it may include a plurality of low-pass filters.

In addition, the filter unit 1312 may include a first low-pass filter for filtering a high frequency band of an image signal, a second low-pass filter for filtering a mid-high frequency band of the image signal, a third low-pass filter for filtering a mid-low frequency band of the image signal. That is, a low frequency band of the image signal is not considered. Thus, the filter unit 1312 may separate the image signal into four frequency bands such as the high frequency band, the mid-high frequency band, the mid-low frequency band, and the low frequency band.

The first calculation unit 1314 may be configured to calculate a high frequency component in each frequency band by calculating difference values between the received original image signal and the filtered signals of the respective frequency bands.

The second calculation unit 1316 may be configured to calculate a final frequency signal in each frequency band by calculating difference values between high frequency components of adjacent frequency bands.

As described above, the frequency separation unit 1310 may use low-pass filters operating in different bands to separate the image signal into the plurality of the frequency bands. Thereafter, the frequency separation unit 1310 may perform Fourier Transform and Inverse Fourier Transform to process the image signal in the frequency domain.

In some cases, instead of converting the image signal into a frequency-domain signal, the frequency separation unit 1310 may obtain a low frequency component of the image in each frequency band by performing a convolution operation on the image using a low-pass filter, $F_n(x,y)$, which corresponds to two-dimension Gaussian filter in the space domain.

As another example, as shown in FIG. 10, the frequency separation unit 1310 may calculate high frequency components in the individual frequency bands using low-pass filters operating in different bands and then calculate a signal of a specific frequency band based on differences between the respective high frequency components.

For example, a filtered image signal $F_n(x,y)$ of each frequency band can be calculated as shown in Equation 1 and Equation 2.

$$F_n(x,y)=K_n \cdot e^{-(x^2+y^2)/\sigma_n^2} \quad \text{Equation 1}$$

In Equation 1, $K_n$ can be determined from the condition that the sum of filter factors is 1 as shown in Equation 2.

$$\iint F_n(x,y)dxdy=1 \quad \text{Equation 2}$$

In addition, a high frequency component $R'_n(x,y)$ of each frequency band can be calculated as shown in Equation 3.

$$R'_n(x, y) = \begin{cases} I(x, y) - F_n(x, y) * I(x, y), & n = 1, 2, 3 \\ I(x, y), & n = 4 \end{cases} \quad \text{Equation 3}$$

In Equation 3, $I(x,y)$ indicates the received image signal and $F_n(x,y)$ indicates the filtered image signal in each frequency band.

Next, a final frequency signal $R_n(x,y)$ of each frequency band can be calculated as shown in Equation 4.

$$R_n(x, y) = \begin{cases} R'_n(x, y), & n = 1 \\ R'_n(x, y) - R'_{n-1}(x, y), & n = 2, 3, 4 \end{cases} \quad \text{Equation 4}$$

Figure 11:
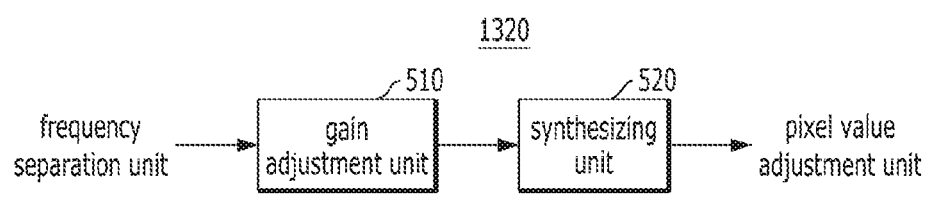
FIGS. 11 and 12 are block diagrams illustrating the gain adjustment unit of FIG. 5.
Figure 12:
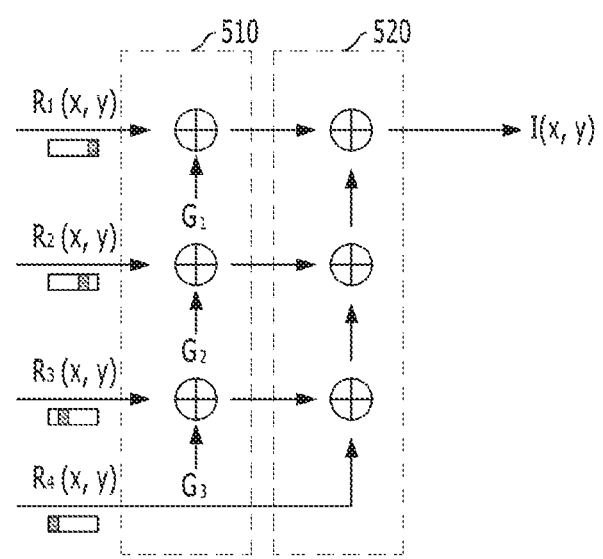

FIGS. 11 and 12 are block diagrams illustrating the gain adjustment unit of FIG. 5.

As shown in FIGS. 11 and 12, the gain control unit 1320 may include a gain adjustment unit 510 and a synthesizing unit 520.

Figure 13:
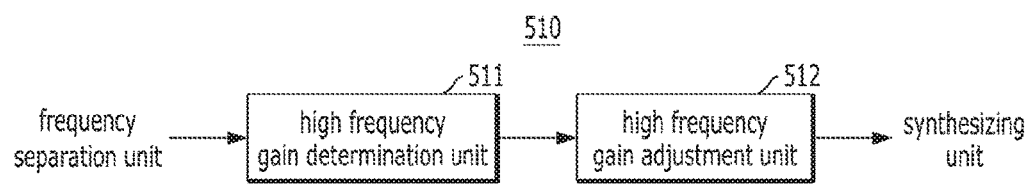
FIGS. 13 to 15 are block diagrams illustrating the gain adjustment unit of FIG. 11.
Figure 14:
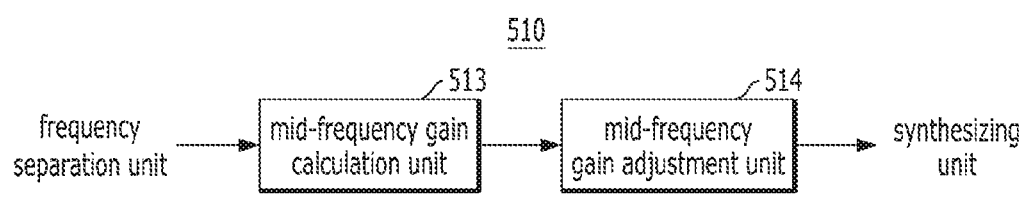

In this case, the gain adjustment unit 510 may include a first gain adjustment unit for adjusting a gain in a high frequency band shown in FIG. 13, a second gain adjustment unit for adjusting a gain in a mid-high frequency band shown in FIG. 14, and a third gain adjustment band for adjusting a gain in a low frequency band.

Referring to FIG. 13, the first gain adjustment unit for adjusting the gain in the high frequency band may include a high frequency gain determination unit 511 and a high frequency gain adjustment unit 512.

If a separated frequency band is the high frequency band, the high frequency gain determination unit 511 may perform normalization by calculating a local variance value of each pixel in the original image of the received image signal and then determine a gain value based on the normalized local variance value.

In some cases, if the separated frequency band is the high frequency band, the high frequency gain determination unit 511 may perform normalization by calculating detail component values of the original image of the received image signal and then determine a gain value in the high frequency band based on the normalized detail component value.

The high frequency gain adjustment unit 512 may adjust a gain of the image signal in the high frequency band based on the determined gain value.

In addition, the high frequency gain adjustment unit 512 may increase the gain in an area where a detail component of the original image is lower than a predetermined value and not increase the gain in an area where the detail component of the original image is higher than the predetermined value.

The high frequency band may affect sharpness of the image.

Thus, as the high frequency component of the image is increased, the sharpness of the image is increased. That is, the first gain adjustment unit for adjusting the gain in the high frequency band may increase definition of the image.

The gain of the high frequency component is determined according to intensity of the detail component. In this case, the detail components may be distinguished from each other using local variance in each area of the original image.

For example, an area with low variance may be considered as a flat area, whereas an area with high variance may be considered as an area including many detail components such as a texture, an edge component, etc.

As described above, the local variance value of each pixel in the original image is calculated and the calculated local variance value is normalized. Thereafter, the gain in the high frequency band can be determined based on the normalized variance value.

In this case, a gain in the flat area is not increased but a gain in an area where the detail component is relatively weak is increased in order to enhance sharpness of the texture or the edge component.

In addition, a gain may not be increased when variance is equal to or greater than a specific threshold value. By doing so, it is possible to prevent sharpness in an area where the detail component is strong from being significantly increased, thereby preventing unnatural display of the image.

The first gain adjustment unit for adjusting the gain in the high frequency band may determine details components of the image using the Laplacian operator instead of calculating the local variance value.

In other words, if the separated frequency band is the high frequency band, the high frequency gain determination unit 511 may perform normalization by calculating the detail component values of the original image of the received image signal and then determine the gain value in the high frequency band based on the normalized detail component value.

For example, a detail component value $L(x,y)$ can be calculated as shown in Equation 5.

$$L(x,y)_{nor.} = \nabla^2 I(x,y) / \max\{|\nabla^2 I(x,y)|\} \quad \text{Equation 5}$$

When a gain value G1 in the high frequency band is determined based on a normalized detail component value, the gain value G1 in the high frequency band can be calculated as shown in Equation 6.

$$G_1 = \begin{cases} 1 + b \cdot \left(1 - \left(\frac{|L(x,y)_{nor.}| - m}{m}\right)^2\right), & |L(x,y)_{nor.}| < m \quad b > 0 \\ 1 + b \cdot \left(1 - \left(\frac{|L(x,y)_{nor.}| - m}{1-m}\right)^2\right), & |L(x,y)_{nor.}| \geq m \quad 0 < m < 1 \end{cases} \quad \text{Equation 6}$$

In Equation 6, b indicates a parameter for adjusting an increase amount of the high frequency component, m indicates a threshold value for determining normalized variance for the maximum gain, and $L(x,y)$ indicates a detail component value.

Figure 16:
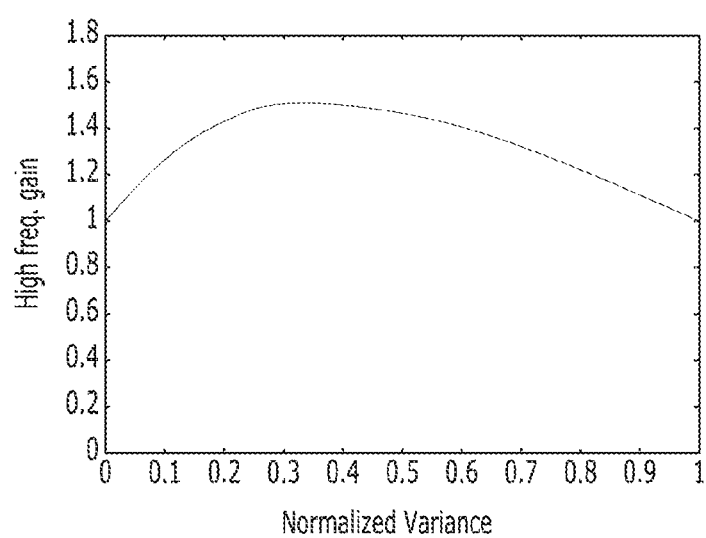
FIG. 16 is a graph illustrating a gain value in a high frequency band in accordance with a normalized variance value.

FIG. 16 is a graph illustrating a gain value in a high frequency band in accordance with a normalized variance value. Referring to FIG. 16, the gain value in the high frequency band can be obtained according to Equation 5 and Equation 6.

In addition, the second gain adjustment unit for adjusting the gain in the mid-high frequency band may include a mid-high frequency gain calculation unit 513 and a mid-high gain adjustment unit 514.

In this case, if the separated frequency band is the mid-high frequency band, the mid-frequency gain calculation unit 513 may divide the mid-frequency band into a mid-high frequency band and a mid-low frequency band and calculate gain values of the divided mid-high frequency band and mid-low frequency band.

The mid-frequency gain adjustment unit 514 may check whether a difference between the calculated gain value of the mid-high frequency band and the calculated gain value of the mid-low frequency band is higher than a reference value. In addition, when the difference between the calculated gain value of the mid-high frequency band and the calculated gain value of the mid-low frequency band is higher than the reference value, the mid-frequency gain adjustment unit may adjust the gain value of the mid-high frequency band or the gain value of the mid-low frequency band.

The mid-frequency band significantly affects contrast of the image

Thus, to adjust intensity of the image contrast, the second gain adjustment unit for adjusting the gain in the mid-frequency band may divide the mid-frequency band into the mid-high frequency band and the mid-low frequency band and then adjust a gain in each of the mid-high frequency band and the mid-low frequency band.

For example, a gain value $G'2(x,y)$ of the mid-high frequency band and a gain value $G'3(x,y)$ of the mid-low frequency band can be calculated according to Equation 7, Equation 8, and Equation 9.

$$G'_n(x,y) = \left(\frac{1}{NR_n(x,y) + \varepsilon_g}\right)^{(1-\tilde{\sigma}_n) \times T(x,y)} \quad \text{Equation 7}$$

In Equation 7, $NRn(x,y)$ indicates a normalized image signal in the corresponding frequency band, $\varepsilon_g$ has a value of 0.1, and $\tilde{\sigma}$ indicates a value normalized according to distribution of a filter.

$$NR_n(x,y) = \frac{|R_n(x,y)|}{|R_n|_{max}}, \tilde{\sigma} = \sqrt{\frac{\sigma_n + \sigma_{max}}{2\sigma_{max}}} \quad \text{Equation 8}$$

$$T(x,y) = \begin{cases} (I(x,y) - I_{min})/(45 - I_{min}) & I(x,y) < 45 \\ 1 & 45 \leq I(x,y) < 200 \\ (I_{max} - I(x,y))/(I_{max} - 200) & I(x,y) \geq 200 \end{cases} \quad \text{Equation 9}$$

In Equation 9, $T(x,y)$ indicates brightness information of the original image.

In addition, the gain value $G2(x,y)$ of the mid-high frequency band and the gain value $G3(x,y)$ of the mid-low frequency band can be adjusted as shown in Equation 10.

$$G_2(x,y) = G'_2(x,y), \text{ and } G_3(x,y) = (1-\text{const}) \cdot G'_3(x,y) \quad \text{Equation 10}$$

Figure 15:
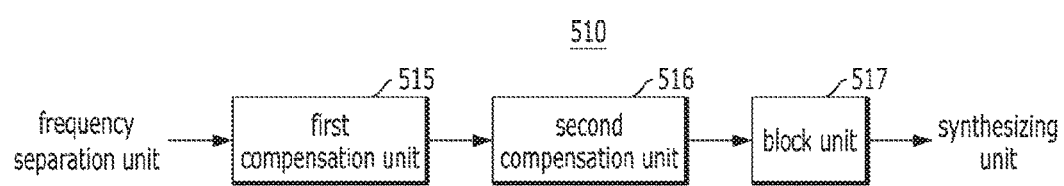

In addition, as shown in FIG. 15, the third gain adjustment unit for adjusting the gain in the low frequency band may include a first compensation unit 515, a second compensation unit 516, and a block unit 517.

In this case, if the separated frequency band is the low frequency band, the first compensation unit 515 may compensate by increasing a pixel value of the low frequency band image at a first rate.

The second compensation unit 516 may check whether the pixel value increased at the first rate reaches a predetermined threshold value. When the pixel value increased at the first rate reaches the predetermined threshold value, the second compensation unit 516 may compensate by further increasing the pixel value at a second rate.

The block unit 517 may check whether the pixel value increased at the second rate reaches the maximum pixel value of the original image. When the pixel value increased at the second rate reaches the maximum pixel value of the original image, the block unit may block increase of the pixel value.

In this case, the first rate may be an increase rate with a straight line slope and the second rate may be an increase rate with a curved line slope.

The low frequency band image may contain brightness information of the entire image.

Thus, if the pixel value is increased in the low frequency domain, the overall brightness of the image can be increased. This is referred to as pixel compensation.

That is, when the power of the digital device is restricted, the overall brightness of the image can be increased. However, in this case, the increased pixel value of the image may exceed an allowed range.

In addition, when a pixel greater than the maximum pixel value is displayed, detail of the bright portion may be saturated because the pixel value greater than the maximum pixel value is dropped. Thus, detail information may disappear.

Therefore, in the case of an image pixel value equal to or lower than a specific threshold value, the pixel value needs to be increased consistently in order to prevent the pixel value from being greater than the maximum pixel value. On the other hand, in the case of an image pixel value greater than the threshold value, the pixel value needs to be increased at a rate with a gentle curved slope so that the increased pixel value does not exceed the maximum pixel value.

The above-mentioned pixel compensation method can be applied as shown in Equation 12.

In Equation, p indicates a size of a pixel value to be compensated and is determined in proportion to the restricted power of the image.

If a threshold value is an 8-bit image signal and its maximum value is 255, the threshold value can be determined as shown in Equation 11.

For example, a predetermined threshold value Th can be calculated according to Equation 11.

$$Th = 255 - 2 \cdot p \qquad \text{Equation 11}$$

In equation 11, p indicates a size of the pixel value to be compensated and Th is the 8-bit image signal having the maximum value of 255.

The pixel value of the low frequency band image, which is increased at the first or second rate, can be calculated as shown in Equation 12.

$$R_{4,P}(x, y) = \begin{cases} R_4(x, y) + p, & (x \le Th) \\ 255 - \frac{1}{4p} \cdot (255 - R_4(x, y))^2, & (x > Th) \end{cases} \qquad \text{Equation 12}$$

The image signals of the individual frequency bands, of which gains are adjusted in the gain adjustment unit 510, are synthesized in the synthesizing unit 520. Thereafter, the enhanced image can be displayed on the screen.

For example, a synthesizing value I'(x,y) for the image signals of the individual frequency bands having the adjusted gains can be calculated as shown in Equation 13.

$$I'(x,y) = R_1(x,y) \cdot G_1(x,y) + R_2(x,y) \cdot G_2(x,y) + R_3(x,y) \cdot G_3(x,y) + R_{4,p}(x,y) \qquad \text{Equation 13}$$

In Equation 13, Rn(x,y) and Gn(x,y) indicate an image signal and a gain in each frequency band, R4(x,y) indicates a low frequency band signal, and R4.P(x,y) indicates a compensation result of the low frequency band signal, R4(x,y).

Figure 17:
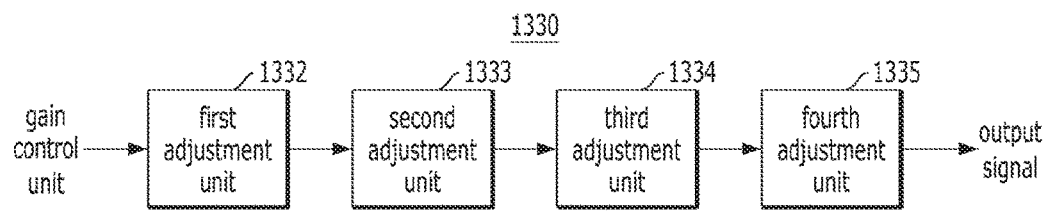
FIG. 17 is a block diagram illustrating the pixel value adjustment unit of FIG. 5.
Figure 18:
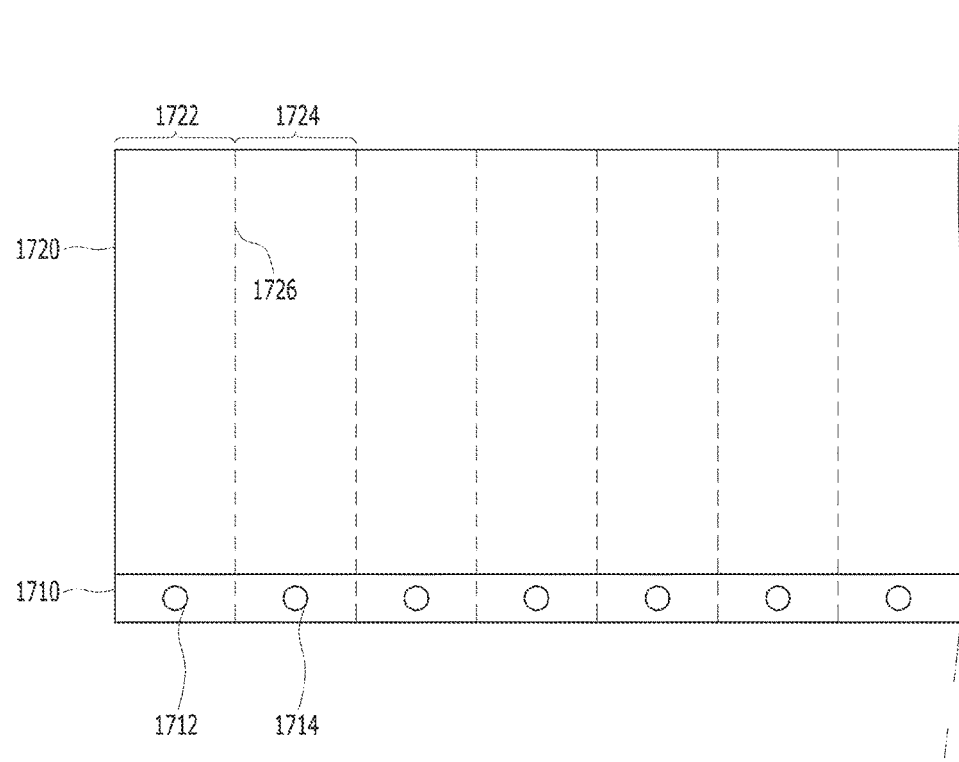
FIG. 18 is a diagram illustrating screen areas divided by the pixel value adjustment unit.
Figure 19:
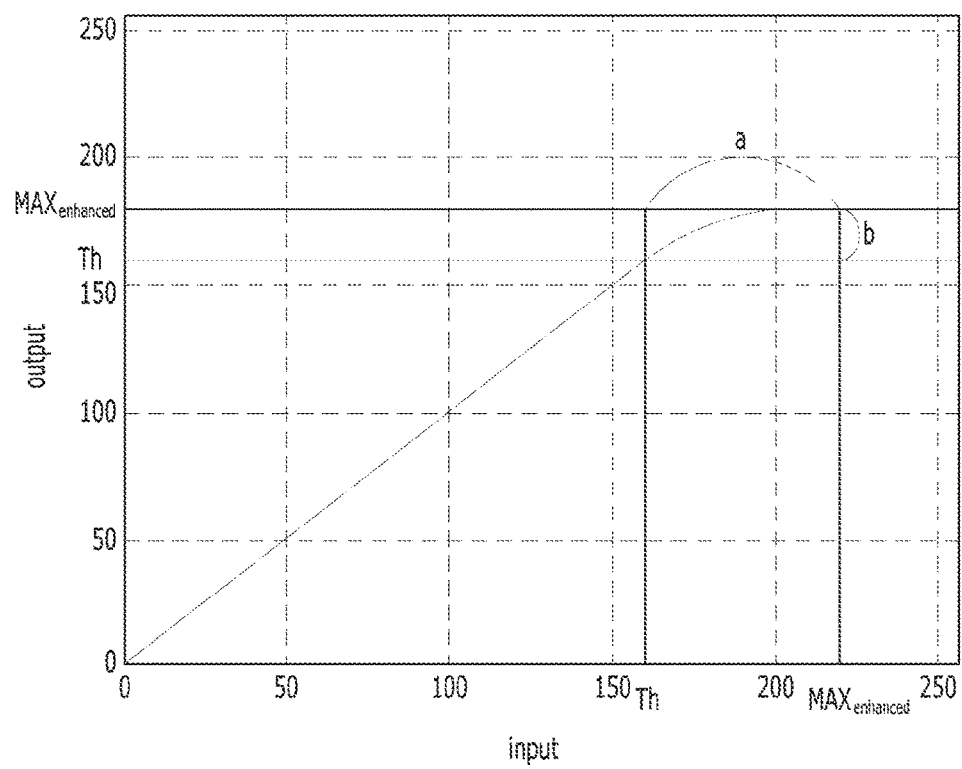
FIG. 19 is a graph illustrating an increase rate of a pixel value in a divided screen area.
Figure 20:
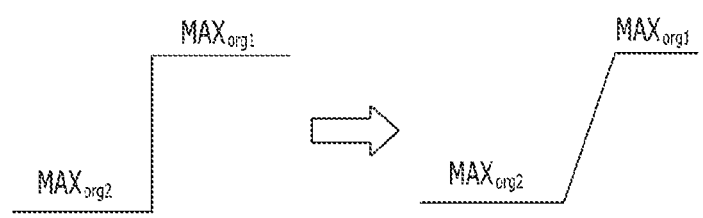
FIG. 20 is a graph illustrating pixel value increase rates of pixels located at a boundary between divided screen areas.
Figure 21:
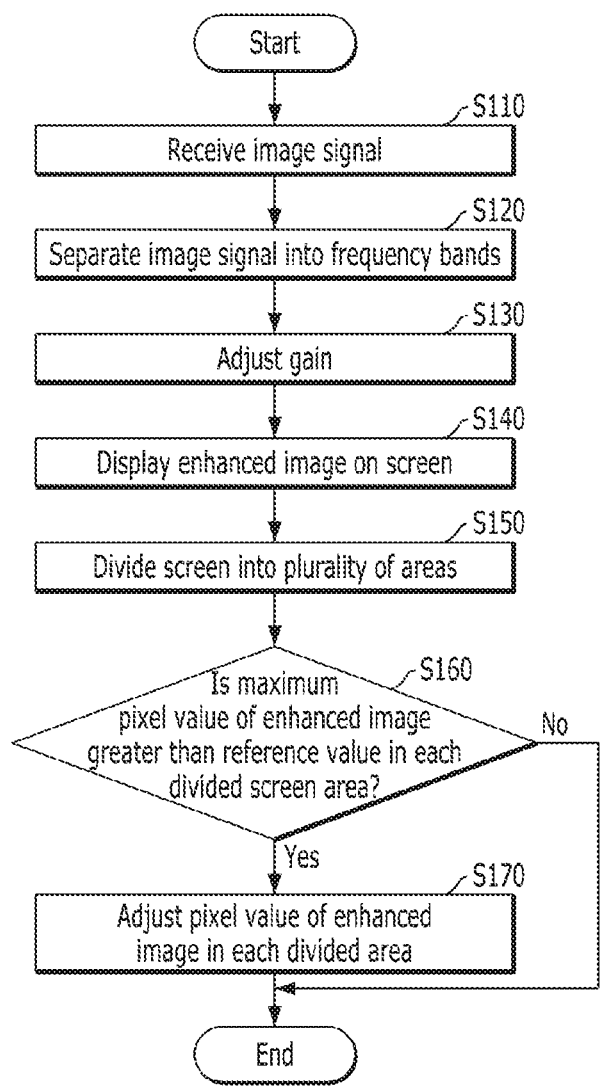
FIGS. 21 to 26 are flowcharts for explaining a method of controlling a digital device according to the present invention.
Figure 22:
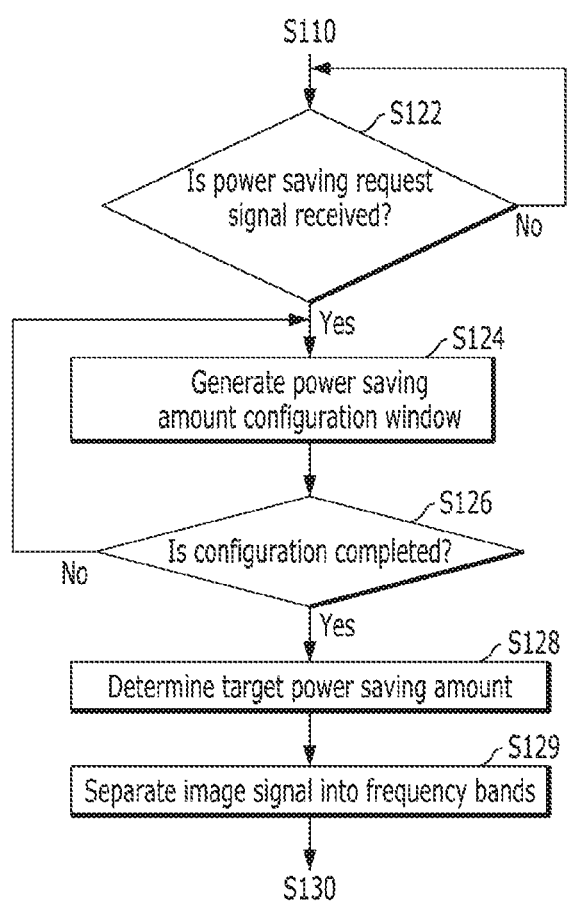
Figure 23:
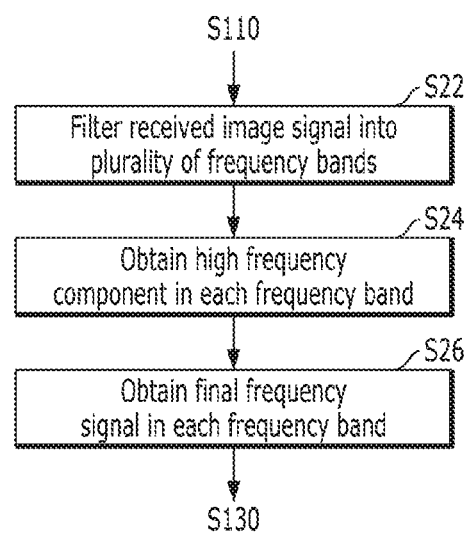
Figure 24:
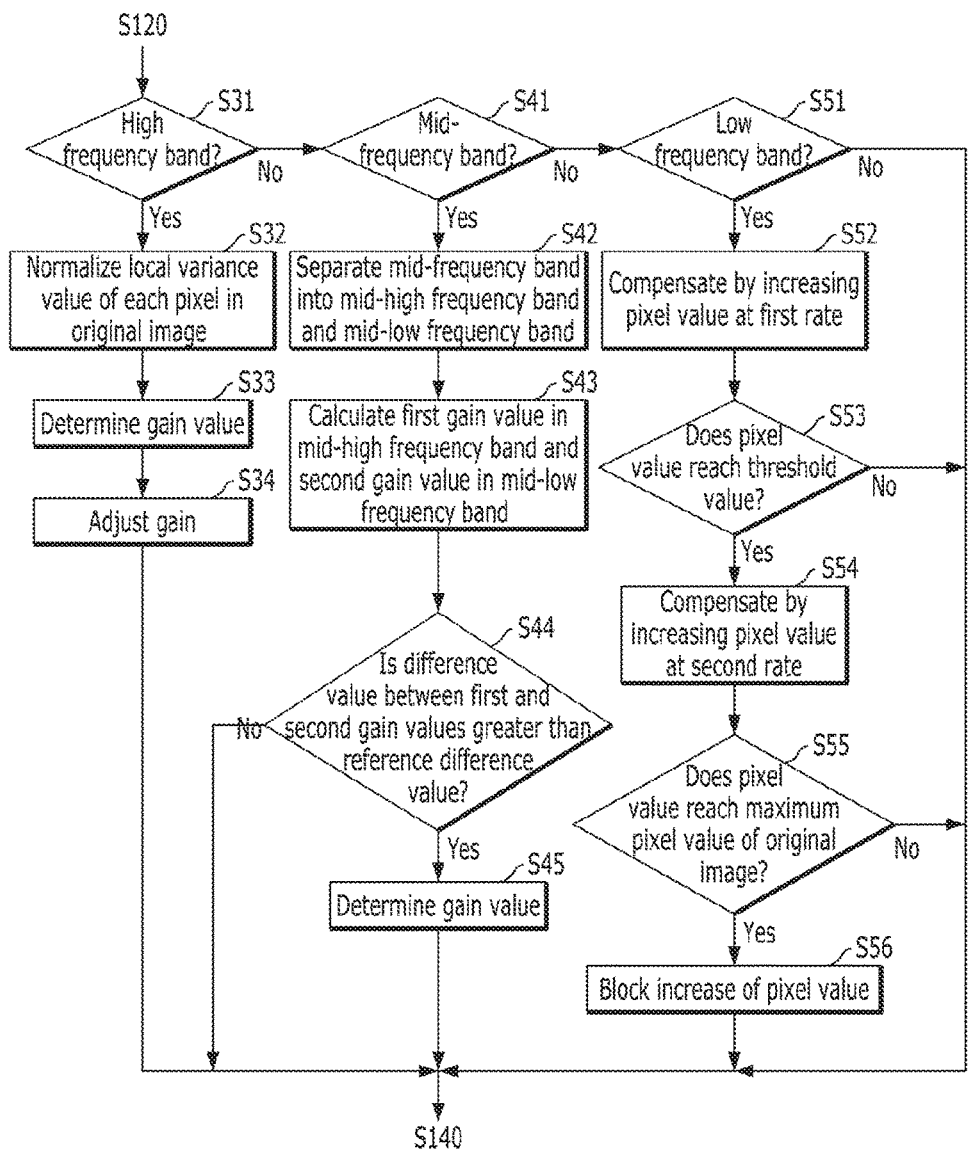
Figure 25:
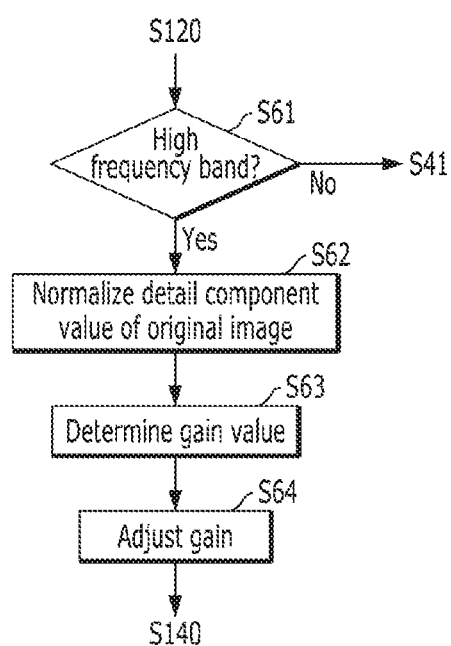
Figure 26:
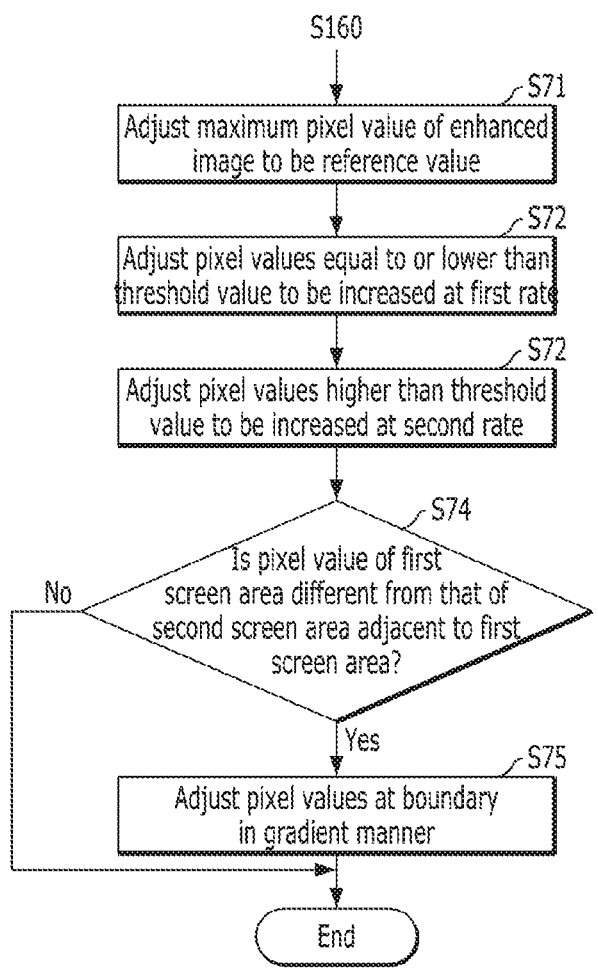

FIG. 17 is a block diagram illustrating the pixel value adjustment unit of FIG. 5. FIG. 18 is a diagram illustrating screen areas divided by the pixel value adjustment unit. FIG. 19 is a graph illustrating an increase rate of a pixel value in a divided screen area. FIG. 20 is a graph illustrating pixel value increase rates of pixels located at a boundary between divided screen areas.

As shown in FIG. 17, the pixel value adjustment unit 1330 may include a first adjustment unit 1332, a second adjustment unit 1333, and a third adjustment unit 1334.

In some cases, the pixel value adjustment unit 1330 may further include a fourth adjustment unit 1335.

In this case, if the maximum pixel value of the enhanced image is greater than the reference value, the first adjustment unit 1332 may determine the maximum pixel value of the enhanced image, which is greater than the reference value, as a new reference value.

In this case, the reference value may be the maximum pixel value of the original image.

The second adjustment unit 1333 may adjust pixel values equal to or lower than a predetermined threshold value among pixel values of the enhanced image to be increased at a first rate.

The third adjustment unit may adjust pixel values higher than the predetermined threshold value among the pixel values of the enhanced image to be increased at a second rate.

In this case, the first rate may be an increase rate with a straight line slope and the second rate may be an increase rate with a curved line slope.

Further, if a maximum pixel value of a first screen area among the divided screen areas is different from that of a second screen area which is adjacent to the first screen area, the fourth adjustment unit 1335 may adjust maximum pixel values of pixels located at a boundary between the first and second screen areas in a gradient manner.

Additionally, when the maximum pixel value of the first screen area is greater than that of the second screen area, the fourth adjustment unit 1335 may increase the maximum pixel values of the pixels located at the boundary between the first and second screen areas such that the values are gradually increased from the second screen area to the first screen area in a gradient manner.

Referring to FIG. 18, when dividing a screen 1720 on which the enhanced image is displayed into a plurality of areas, the pixel value adjustment unit may determine each of the divided screen areas as a screen area that is managed by a single light source among a plurality of light resources included in a light source module.

For example, the pixel value adjustment unit may determine each of the divided screen areas as a screen area where 16 pixel lines are arranged.

Thus, to adjust pixel values of the individual divided screen areas, the pixel value adjustment unit may require the maximum pixel value of the enhance image and the maximum pixel value of the original image in the screen area where the 16 pixel lines managed by the respective light sources are arranged.

Hereinafter, the maximum pixel value of the original image in a screen area managed by a single light source is represented as $MAX_{org}$ and the maximum pixel value of the enhanced image in the same area is represented as $MAX_{enhanced}$. In the case of $MAX_{enhanced} \leq MAX_{org}$, since the maximum pixel value of the enhanced image is not greater than that of the original image, the maximum pixel value of the enhanced image does not need to be adjusted.

However, in the case of $MAX_{enhanced} > MAX_{org}$, since the maximum pixel value of the enhanced image is greater than that of the original image, the maximum pixel value of the enhanced image needs to be adjusted as the maximum pixel value of the original image.

In this case, since all pixel values of the enhanced image greater than the maximum pixel value of the original image are replaced with the maximum pixel value of the original image, the maximum pixel value is saturated in a bright portion of the image and thus, detail information disappears.

Therefore, in the case of a pixel value equal to or greater than a specific threshold value, the pixel value is increased at a rate with a gentle curved slope so that the increased pixel value does not exceed the maximum pixel value. Hence, loss of the detail information in the bright portion can be minimized.

For example, adjustment of the pixel value of the enhanced image may be performed according to Equations 14 to 18 below.

$$y = \begin{cases} x, & (x \leq Th) \\ MAX_{org} - \dfrac{b}{a^r} \cdot (MAX_{enhanced} - x)^r, & (x > Th) \end{cases} \quad \text{Equation 14}$$

In Equation 14, MAXorg indicates the maximum pixel value of the original image, MAXenhanced indicates the maximum pixel value of the enhanced image, and Th indicates the predetermined threshold value.

$Th = MAX_{org} - (MAX_{enhanced} - MAX_{org})/2$ \hfill Equation 15

$a = MAX_{enhanced} - Th$ \hfill Equation 16

$b = MAX_{org} - Th$ \hfill Equation 17

$r = a/b$ \hfill Equation 18

In addition, as show in FIG. 18, when a maximum pixel value of a first screen area 1722 among the divided screen areas is different from that of a second screen area 1724 which is adjacent to the first screen area, the pixel value adjustment unit may adjust maximum pixel values of pixels located at a boundary 1726 between the first and second screen areas 1722 and 1724 in a gradient manner.

Additionally, when the maximum pixel value of the first screen area 1722 is greater than that of the second screen area 1724, the pixel value adjustment unit may increase the maximum pixel values of the pixels located at the boundary 1726 between the first and second screen areas 1722 and 1724 such that the values are gradually increased from the second screen area 1724 to the first screen area 1722 in a gradient manner.

For example, the maximum pixel value $MAX_{org}$ of the original image and the maximum pixel value $MAX_{enhanced}$ of the enhanced image is calculated in each of the divided screen areas. If the maximum pixel value $MAX_{org1}$ of the first screen area is different from the maximum pixel value $MAX_{org2}$ of the second screen area adjacent to the first screen area, there may be image noise such as a line artifact at the boundary therebetween.

To overcome the above-mentioned problem, when the maximum pixel value $MAX_{org1}$ of the first screen area is different from the maximum pixel value $MAX_{org2}$ of the second screen area adjacent to the first screen area, the maximum pixel values of the pixels located at the boundary 1726 between the first and second screen areas 1722 and 1724 can be adjusted in a gradient manner.

Moreover, since that the threshold value Th also affects change in the pixel values, threshold values of the pixels located at the boundary between the first and second screen areas 1722 and 1724 can also be adjusted in a gradient manner.

FIGS. 21 to 26 are flowcharts for explaining a method of controlling a digital device according to the present invention.

As illustrated in FIGS. 21 to 26, a controller of a digital device may receive an image signal [S110] and separate the received image signal into a plurality of frequency bands [S120].

In this case, if receiving a power saving request signal from the outside, the controller may perform operation of separating the received image signal into the plurality of frequency bands.

For example, to separate the received image signal into the plurality of the frequency bands, the controller may receive the power saving request signal from the outside, determine a target power saving amount based on the received power saving request signal, and separate the received image signal into the plurality of the frequency bands based on the determined target power saving amount.

That is, when receiving the power saving request signal from the outside [S122], the controller may generate a target power saving amount configuration window and then display the generated target power saving amount configuration window 1540 on a screen of a display module [S124]. After the target power saving amount is configured through the displayed target power saving amount configuration window [S126], the controller determines the target power saving amount [S128]. Thereafter, the controller may separate the received image signal into the plurality of the frequency bands based on the determined target power saving amount [S129].

The controller performs filtering on the received image signal into the plurality of the frequency bands [S22], calculates a high frequency component in each frequency band by calculating difference values between the received image signal and the filtered signals of the respective frequency bands [S24], and then calculates a final frequency signal in each frequency band by calculating difference values between high frequency components of adjacent frequency bands [S26].

In this case, a filtered image signal Fn(x,y) of each frequency band can be calculated as shown in Equation 1 and Equation 2.

$$F_n(x,y) = K_n \cdot e^{-(x^2+y^2)/\sigma_n^2} \quad \text{Equation 1}$$

In Equation 1, Kn can be determined from the condition that the sum of filter factors is 1 as shown in Equation 2

$$\iint F_n(x,y)dxdy = 1 \quad \text{Equation 2}$$

In addition, a high frequency component R'n(x,y) of each frequency band can be calculated as shown in Equation 3.

$$R'_n(x, y) = \begin{cases} I(x, y) - F_n(x, y) * I(x, y), & n = 1, 2, 3 \\ I(x, y), & n = 4 \end{cases} \quad \text{Equation 3}$$

In Equation 3, I(x,y) indicates the received image signal and Fn(x,y) indicates the filtered image signal in each frequency band.

Next, a final frequency signal Rn(x,y) of each frequency band can be calculated as shown in Equation 4.

$$R_n(x, y) = \begin{cases} R'_n(x, y), & n = 1 \\ R'_n(x, y) - R'_{n-1}(x, y), & n = 2, 3, 4 \end{cases} \quad \text{Equation 4}$$

The controller can separate the received image signal into the following four frequency bands: a high frequency band; a mid-high frequency band; a mid-low frequency band; and a low frequency band.

Thereafter, the controller adjusts gains of image signals separated into the individual frequency bands [S130].

To adjust the gains of the image signals separated into the individual frequency bands, the controller checks whether a separated frequency band is the high frequency band [S31]. When the separated frequency band is the high frequency band, the controller performs normalization by calculating a local variance value of each pixel in the original image of the received image signal [S32] and determines a gain value based on the normalized local variance value [S33]. Thereafter, the controller adjusts a gain of the high frequency band image signal based on the determined gain value [S34].

In this case, the controller may increase the gain in an area where a detail component of the original image is lower than a predetermined value and not increase the gain in an area where the detail component of the original image is higher than the predetermined value.

In some cases, to adjust the gains of the image signals separated into the individual frequency bands, the controller checks whether a separated frequency band is the high frequency band [S61]. When the separated frequency band is the high frequency band, the controller performs normalization by calculating detail component values of the original image of the received image signal [S62] and determines a gain value in the high frequency band based on the normalized detail component value [S63]. Thereafter, the controller adjusts a gain of the high frequency band image signal based on the determined gain value [S64].

In this case, a detail component value L(x,y) can be calculated as shown in Equation 5.

$$L(x,y)_{nor.} = \nabla^2 I(x,y)/\max\{|\nabla^2 I(x,y)|\} \quad \text{Equation 5}$$

In addition, a gain value G1 in the high frequency band can be calculated as shown in Equation 6.

$$G_1 = \begin{cases} 1 + b \cdot \left(1 - \left(\frac{|L(x, y)_{nor.}| - m}{m}\right)^2\right), & |L(x, y)_{nor.}| < m \quad b > 0 \\ 1 + b \cdot \left(1 - \left(\frac{|L(x, y)_{nor.}| - m}{1 - m}\right)^2\right), & |L(x, y)_{nor.}| \geq m \quad 0 < m < 1 \end{cases} \quad \text{Equation 6}$$

In Equation 6, b indicates a parameter for adjusting an increase amount of the high frequency component, m indicates a threshold value for determining normalized variance for the maximum gain, and L(x,y) indicates a detail component value.

When the separated frequency band is not the high frequency band, the controller checks whether the separated frequency band is the mid-frequency band [S41]. When the separated frequency band is the mid-frequency band, the controller divides the mid-frequency band into the mid-high frequency band and the mid-low frequency band [S42].

The controller calculates gain values in the divided mid-high frequency band and mid-low frequency band [S43] and checks whether a difference value between the calculated gain value in the mid-high frequency band and the calculated gain value in the mid-low frequency band is greater than a reference difference value [S44]. When the difference value between the calculated gain value in the mid-high frequency band and the calculated gain value in the mid-low frequency band is greater than the reference difference value, the controller adjusts the gain value of the mid-high frequency band or the gain value of the mid-low frequency band.

In this case, a gain value G'2(x,y) of the mid-high frequency band and a gain value G'3(x,y) of the mid-low frequency band can be calculated according to Equation 7, Equation 8, and Equation 9.

$$G'_n(x, y) = \left(\frac{1}{NR_n(x, y) + \varepsilon_g}\right)^{(1-\tilde{\sigma}_n) \times T(x,y)} \quad \text{Equation 7}$$

In Equation 7, NRn(x,y) indicates a normalized image signal in the corresponding frequency band, $\varepsilon_g$ has a value of 0.1, and $\tilde{\sigma}_n$ indicates a value normalized according to distribution of a filter.

$$NR_n(x, y) = \frac{|R_n(x, y)|}{|R_n|_{max}}, \quad \tilde{\sigma} = \sqrt{\frac{\sigma_n + \sigma_{max}}{2\sigma_{max}}} \quad \text{Equation 8}$$

$$T(x, y) = \begin{cases} (I(x, y) - I_{min})/(45 - I_{min}) & I(x, y) < 45 \\ 1 & 45 \leq I(x, y) < 200 \\ (I_{max} - I(x, y))/(I_{max} - 200) & I(x, y) \geq 200 \end{cases} \quad \text{Equation 9}$$

In Equation 9, T(x,y) indicates brightness information of the original image.

In addition, the gain value G2(x,y) of the mid-high frequency band and the gain value G3(x,y) can be adjusted as shown in Equation 10.

$$G_2(x,y) = G'_2(x,y), \text{ and } G_3(x,y) = (1-\text{const}) \cdot G'_3(x,y) \quad \text{Equation 10}$$

When the separated frequency band is not the mid-frequency band, the controller checks whether the separated frequency band is the low frequency band [S51]. If the separated frequency band is the low frequency band, the controller compensates by increasing a pixel value of the low frequency band image at a first rate [S52].

Thereafter, the controller checks whether the pixel value increased at the first rate reaches a predetermined threshold value [S53]. When the pixel value increased at the first rate reaches the predetermined threshold value, the controller compensates by further increasing the pixel value at a second rate [S54] and checks whether the pixel value increased at the second rate reaches the maximum pixel value of the original image [S55]. When the pixel value increased at the second rate reaches the maximum pixel value of the original image, the controller blocks increase of the pixel value [S56].

In this case, the first rate may be an increase rate with a straight line slope and the second rate may be an increase rate with a curved line slope.

In addition, a predetermined threshold value Th can be calculated according to Equation 11.

$$Th = 255 - 2p \qquad \text{Equation 11}$$

In equation 11, p indicates a size of the pixel value to be compensated and Th is the 8-bit image signal having the maximum value of 255.

The pixel value of the low frequency band image, which is increased at the first or second rate, can be calculated as shown in Equation 12.

$$R_{4,P}(x,y) = \begin{cases} R_4(x,y) + p, & (x \le Th) \\ 255 - \dfrac{1}{4p} \cdot (255 - R_4(x,y))^2, & (x > Th) \end{cases} \qquad \text{Equation 12}$$

Next, the controller displays an enhanced image by synthesizing the image signals of the individual frequency bands, of which gains are adjusted [S140].

In this case, a synthesizing value I'(x,y) for the image signals of the individual frequency bands having the adjusted gains can be calculated as shown in Equation 13.

$$I'(x,y) = R_1(x,y) \cdot G_1(x,y) + R_2(x,y) \cdot G_2(x,y) + R_3(x,y) \cdot G_3(x,y) + R_{4,P}(x,y) \qquad \text{Equation 13}$$

In Equation 13, Rn(x,y) and Gn(x,y) indicate an image signal and a gain in each frequency band, R4(x,y) indicates a low frequency band signal, and R4.P(x,y) indicates a compensation result of the low frequency band signal, R4(x,y).

Thereafter, the controller divides a screen on which the enhanced image is displayed into a plurality of areas [S150].

In this case, each of the divided screen area may be managed by a single light source among a plurality of light resources included in the light source module.

Moreover, about 16 pixel lines may be arranged in each of the divided screen area.

The controller checks whether the maximum pixel value of the enhanced image displayed on the divided screen areas is greater than a reference value [S160].

In this case, the reference value may be the maximum pixel value of the original image.

When the maximum pixel value of the enhanced image is greater than the reference value, the controller may adjust a pixel value of the enhanced image displayed on the divided screen areas [S170].

That is, when the maximum pixel value of the enhanced image is greater than the reference value, the controller determines the maximum pixel value of the enhanced image, which is greater than the reference value, as a new reference value [S71]. The controller adjusts pixel values equal to or lower than a predetermined threshold value among pixel values of the enhanced image to be increased at a first rate [S72]. The controller adjusts pixel values higher than the predetermined threshold value among the pixel values of the enhanced image to be increased at a second rate [S73].

In this case, the first rate may be an increase rate with a straight line slope and the second rate may be an increase rate with a curved line slope.

Further, adjustment of the pixel value of the enhanced image may be performed according to Equations 14 to 18 below.

$$y = \begin{cases} x, & (x \le Th) \\ MAX_{org} - \dfrac{b}{a^r} \cdot (MAX_{enhanced} - x)^r, & (x > Th) \end{cases} \qquad \text{Equation 14}$$

In Equation 14, MAXorg indicates the maximum pixel value of the original image, MAXenhanced indicates the maximum pixel value of the enhanced image, and Th indicates the predetermined threshold value.

$$Th = MAX_{org} - (MAX_{enhanced} - MAX_{org})/2 \qquad \text{Equation 15}$$

$$a = MAX_{enhanced} - Th \qquad \text{Equation 16}$$

$$b = MAX_{org} - Th \qquad \text{Equation 17}$$

$$r = a/b \qquad \text{Equation 18}$$

If a maximum pixel value of a first screen area among the divided screen areas is different from that of a second screen area which is adjacent to the first screen area [S74], the controller may adjust maximum pixel values of pixels located at a boundary between the first and second screen areas in a gradient manner [S75].

For example, if the maximum pixel value of the first screen area is greater than that of the second screen area, the controller may increase the maximum pixel values of the pixels located at the boundary between the first and second screen areas such that the values are gradually increased from the second screen area to the first screen area in a gradient manner.

According to the present invention, it is possible to not only minimize image quality degradation and but also reduce power consumption by performing the preprocessing process for improving contrast and sharpness of an image and the post processing process for dividing a screen into a plurality of screen areas and adjusting maximum pixel values of the divided screen areas.

In addition, according to the present invention, it is possible to minimize image quality degradation while reducing power consumption based on a target power saving amount, which is configured by a user through a displayed target power saving amount configuration window, thereby improving user convenience.

MODE FOR CARRYING OUT INVENTION

The digital device and control method thereof disclosed in the present specification are not limited to the configurations and methods described above with reference to the embodiments. In addition, some or all of the embodiments are selectively combined for various modifications.

Meanwhile, the control method for the digital device according to the present invention may be implemented as code that can be written on a processor-readable recording medium and thus read by a processor provided in a network device. The processor-readable recording medium may include all kinds of recording media where data that can be read by the processor are stored. The processor-readable recording medium may include, for example, a read only memory (ROM), a random access memory (RAM), a CD-ROM, a magnetic tape, a floppy disk, and an optical data memory and it may be implemented in the form of a carrier wave transmitted over the Internet. In addition, the processor-readable recording medium may be distributed over a plurality of computer systems connected to a network such that processor-readable code is written thereto and executed therefrom in a decentralized manner.

Further, although the present invention is described with reference to the accompanying drawings, this is merely exemplary. Thus, the detailed description will not be limited to such exemplary embodiments and it should be understood that various modifications that can be made by anyone skilled in the art, to which the present invention relates, come within the scope of the appended claims and their equivalents. It is also apparent that such variations of this specification are not to be understood individually or separately from the technical scope or spirit of this specification.

INDUSTRIAL APPLICABILITY

The present invention relates to a digital device for improving image quality with low power and control method thereof and thus, the invention has industrial applicability.

What is claimed is:

1. A method of controlling a digital device, the method comprising:
   receiving an image signal;
   separating the received image signal into a plurality of frequency bands;
   adjusting gains of image signals separated into respective frequency bands;
   displaying an enhanced image on a screen by synthesizing the images signals in the respective frequency bands of which the gains are adjusted;
   dividing the screen on which the enhanced image is displayed into a plurality of screen areas;
   checking whether a maximum pixel value of the enhanced image displayed on the divided screen areas is greater than a reference value;
   when the maximum pixel value of the enhanced image is greater than the reference value, adjusting a pixel value of the enhanced image displayed on the divided screen areas; and
   after adjusting the pixel value of the enhanced image displayed on the divided screen areas, when a maximum pixel value of a first screen area among the divided screen areas is different from a maximum pixel value of a second screen area which is adjacent to the first screen area, adjusting maximum pixel values of pixels located at a boundary between the first and second screen areas in a gradient manner.

2. The method of claim 1, wherein separating the received image signal into the plurality of the frequency bands comprises:
   filtering the received image signal into the plurality of the frequency bands;
   determining a high frequency component in each frequency band by calculating a difference value between the received image signal and the image signal filtered into the respective frequency bands; and
   determining a final frequency signal in each frequency band by calculating a difference value between high frequency components in adjacent frequency bands.

3. The method of claim 1, wherein adjusting the gains of the image signals separated into the respective frequency bands comprises:
   checking whether a separated frequency band is a high frequency band;
   when the separated frequency band is the high frequency band, performing normalization by calculating a local variance value of each pixel in an original image of the received image signal;
   determining a gain value based on the normalized local variance value; and
   adjusting a gain of an image signal in the high frequency band based on the determined gain value.

4. The method of claim 3, wherein adjusting the gain comprises:
   increasing the gain in an area where a detail component of the original image is weaker than a predetermined value; and
   blocking an increase in the gain in an area where the detail component of the original image is stronger than the predetermined value.

5. The method of claim 1, wherein adjusting the gains of the image signals separated into the respective frequency bands comprises:
   checking whether a separated frequency band is a high frequency band;
   when the separated frequency band is the high frequency band, performing normalization by calculating a detail component value in an original image of the received image signal;
   determining a gain value in the high frequency band based on the normalized detail component value; and
   adjusting a gain of an image signal in the high frequency band based on the determined gain value.

6. The method of claim 5, wherein checking whether the separated frequency band is the high frequency band comprises:
   when the separated frequency band is not the high frequency band, checking whether the separated frequency band is a mid-frequency band;
   when the separated frequency band is the mid-frequency band, separating the mid-frequency band into a mid-high frequency band and a mid-low frequency band;
   calculating gain values in the separated mid-high frequency band and mid-low frequency band;
   checking whether a difference value between the calculated gain value in the mid-high frequency band and the calculated gain value in the mid-low frequency band is greater than a reference difference value; and
   when the difference value between the calculated gain value in the mid-high frequency band and the calculated gain value in the mid-low frequency band is greater than the reference difference value, adjusting the gain value of the mid-high frequency band or the gain value of the mid-low frequency band.

7. The method of claim 6, wherein checking whether the separated frequency band is the mid-frequency band comprises:
   when the separated frequency band is not the mid-frequency band, checking whether the separated frequency band is a low frequency band;
   when the separated frequency band is the low frequency band, compensating by increasing a pixel value of a low frequency band image at a first rate;
   checking whether the pixel value increased at the first rate reaches a predetermined threshold value;
   when the pixel value increased at the first rate reaches the predetermined threshold value, compensating by increasing the pixel value at a second rate;
   checking whether the pixel value increased at the second rate reaches a maximum pixel value of the original image; and when the pixel value increased at the second rate reaches the maximum pixel value of the original image, blocking an increase of the pixel value.

8. The method of claim 7, wherein the first rate is an increase rate with a straight line slope and the second rate is an increase rate with a curved line slope.

9. The method of claim 1, wherein adjusting the pixel value of the enhanced image displayed on the divided screen areas when the maximum pixel value of the enhanced image is greater than the reference value comprises:
when the maximum pixel value of the enhanced image is greater than the reference value, adjusting the maximum pixel value of the enhanced image, which is greater than the reference value, to be the reference value;
adjusting pixel values equal to or lower than a predetermined threshold value among pixel values of the enhanced image to be increased at a first rate; and
adjusting pixel values higher than the predetermined threshold value among the pixel values of the enhanced image to be increased at a second rate.

10. The method of claim 9, wherein the first rate is an increase rate with a straight line slope and the second rate is an increase rate with a curved line slope.

11. A digital device, comprising:
a communication module configured to receive an image signal;
a display configured to display an enhanced image on a screen after processing the image signal; and
a controller for controlling operation of the digital device, wherein the controller is configured to:
separate the received image signal into a plurality of frequency bands;
adjust gains of image signals separated by the frequency separation unit into the respective frequency bands;
synthesize the images signals in the respective frequency bands of which the gains are adjusted;
control the display to display the enhanced image on the screen of the display;
divide the screen of the display on which the enhanced image is displayed into a plurality of screen areas;
check whether a maximum pixel value of the enhanced image displayed on the divided screen areas is greater than a reference value;
when the maximum pixel value of the enhanced image is greater than the reference value, adjust a pixel value of the enhanced image displayed on the divided screen areas; and
after adjusting the pixel value of the enhanced image displayed on the divided screen areas, when a maximum pixel value of a first screen area among the divided screen areas is different from a maximum pixel value of a second screen area which is adjacent to the first screen area, adjust maximum pixel values of pixels located at a boundary between the first and second screen areas in a gradient manner.

12. The digital device of claim 11, wherein when a power saving request signal is received from outside, the controller separates the received image signal into the plurality of the frequency bands.

13. The digital device of claim 11, wherein separating the received image signal into the plurality of the frequency bands comprises:
filtering on the received image signal into the plurality of the frequency bands;
determining a high frequency component in each frequency band by calculating a difference value between the received image signal and the image signal filtered into the respective frequency bands; and
determining a final frequency signal in each frequency band by calculating a difference value between high frequency components in adjacent frequency bands.

14. The digital device of claim 11, wherein adjusting the gains of the image signals separated into the respective frequency bands comprises:
when a separated frequency band is a high frequency band, performing normalization by calculating a local variance value of each pixel in an original image of the received image signal;
determining a gain value based on the normalized local variance value; and
adjusting a gain of an image signal in the high frequency band based on the determined gain value.

15. The digital device of claim 11, wherein adjusting the gains of the image signals separated into the respective frequency bands comprises:
when a separated frequency band is a high frequency band, performing normalization by calculating a detail component value in an original image of the received image signal;
determining a gain value in the high frequency band based on the normalized detail component value; and
adjusting a gain of an image signal in the high frequency band based on the determined gain value.

16. The digital device of claim 11, wherein the controller is further configured to:
when a separated frequency band is a mid-frequency band, separate the mid-frequency band into a mid-high frequency band and a mid-low frequency band;
calculate gain values in the separated mid-high frequency band and mid-low frequency band;
check whether a difference value between the calculated gain value in the mid-high frequency band and the calculated gain value in the mid-low frequency band is greater than a reference difference value; and
when the difference value between the calculated gain value in the mid-high frequency band and the calculated gain value in the mid-low frequency band is greater than the reference difference value, adjust the gain value of the mid-high frequency band or the gain value of the mid-low frequency band.

17. The digital device of claim 11, wherein the controller is further configured to:
when a separated frequency band is a low frequency band, compensate by increasing a pixel value of a low frequency band image at a first rate;
check whether the pixel value increased at the first rate reaches a predetermined threshold value;
when the pixel value increased at the first rate reaches the predetermined threshold value, compensate by increasing the pixel value at a second rate;
check whether the pixel value increased at the second rate reaches a maximum pixel value of an original image; and
when the pixel value increased at the second rate reaches the maximum pixel value of the original image, block an increase of the pixel value.

18. The digital device of claim 11, wherein the adjusting the pixel value of the enhanced image displayed on the divided screen areas when the maximum pixel value of the enhanced image is greater than the reference value comprises:
when the maximum pixel value of the enhanced image is greater than the reference value, adjusting the maximum pixel value of the enhanced image, which is greater than the reference value, to be the reference value;

adjusting pixel values equal to or lower than a predetermined threshold value among pixel values of the enhanced image to be increased at a first rate; and adjusting pixel values higher than the predetermined threshold value among the pixel values of the enhanced image to be increased at a second rate.

* * * * *